(12) United States Patent
Nishikawa et al.

(10) Patent No.: US 11,069,413 B2
(45) Date of Patent: Jul. 20, 2021

(54) MEMORY SYSTEM AND NONVOLATILE MEMORY

(71) Applicant: Kioxia Corporation, Minato-ku (JP)

(72) Inventors: Suguru Nishikawa, Osaka (JP); Riki Suzuki, Yokohama (JP); Yoshihisa Kojima, Kawasaki (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 16/799,885

(22) Filed: Feb. 25, 2020

(65) Prior Publication Data

US 2020/0303012 A1 Sep. 24, 2020

(30) Foreign Application Priority Data

Mar. 20, 2019 (JP) .............................. JP2019-053284

(51) Int. Cl.
| | |
|---|---|
| *G11C 16/16* | (2006.01) |
| *G11C 16/26* | (2006.01) |
| *G06F 13/16* | (2006.01) |
| *G11C 16/34* | (2006.01) |
| *G11C 16/12* | (2006.01) |

(52) U.S. Cl.
CPC .......... *G11C 16/16* (2013.01); *G06F 13/1668* (2013.01); *G11C 16/12* (2013.01); *G11C 16/26* (2013.01); *G11C 16/349* (2013.01)

(58) Field of Classification Search
CPC ....................................................... G11C 16/16
USPC ....................................................... 365/185.29
See application file for complete search history.

(56) References Cited

U.S. PATENT DOCUMENTS

| | | | |
|---|---|---|---|
| 8,364,888 B2 | 1/2013 | Melik-Martirosian et al. | |
| 9,886,214 B2 | 2/2018 | Micheloni et al. | |
| 2014/0215175 A1* | 7/2014 | Kasorla ................... | G06F 13/26 711/167 |
| 2017/0168752 A1* | 6/2017 | Micheloni ............. | G06F 3/0604 |
| 2017/0262229 A1* | 9/2017 | Ochi ...................... | G06F 3/0688 |
| 2018/0196622 A1 | 7/2018 | Oshimi et al. | |
| 2018/0197610 A1* | 7/2018 | Lee ..................... | G11C 16/3459 |

\* cited by examiner

*Primary Examiner* — Min Huang
(74) *Attorney, Agent, or Firm* — Oblon, McClelland, Maier & Neustadt, L.L.P.

(57) ABSTRACT

According to one embodiment, a memory system includes a nonvolatile memory and a memory controller that controls operation of the nonvolatile memory. The nonvolatile memory is configured to receive, from the memory controller, a first command for execution of at least one of an erase operation and a program operation; in response to receiving a second command from the memory controller during execution of a first operation requested by the first command, execute a second operation for suspending the first operation before the first operation reaches a given section; and in response to receiving a third command from the memory controller during the execution of the first operation, suspend the first operation after the given section.

11 Claims, 24 Drawing Sheets

FIG.3

ERASE-SUSPEND PLAN TABLE 14b

| NUMBER OF ERASED BLOCKS | BUDGET COUNT OF ERASE-SUSPEND WITH ROLLBACK | BUDGET COUNT OF ERASE-SUSPEND WITHOUT ROLLBACK |
|---|---|---|
| 3 | 2 | 0 |
| 2 | 1 | 1 |
| 1 | 0 | 2 |
| 0 | 0 | 0 |

FIG.4

CURRENTLY AVAILABLE COUNT OF ERASE-SUSPEND 14c

| | SUSPEND WITH ROLLBACK | SUSPEND WITHOUT ROLLBACK |
|---|---|---|
| AVAILABLE COUNT | 1 | 2 |

FIG.5

PROGRAM-SUSPEND PLAN TABLE 14e

| FREE SPACE OF WB (UNIT: 4 kB ENTRY) | BUDGET COUNT OF PROGRAM-SUSPEND WITH ROLLBACK | BUDGET COUNT OF PROGRAM-SUSPEND WITHOUT ROLLBACK |
|---|---|---|
| 70 TO 100 | 2 | 0 |
| 50 TO 70 | 1 | 1 |
| 30 TO 50 | 0 | 2 |
| 0 TO 30 | 0 | 0 |

FIG.6

CURRENTLY AVAILABLE COUNT OF PROGRAM-SUSPEND 14f

| | SUSPEND WITH ROLLBACK | SUSPEND WITHOUT ROLLBACK |
|---|---|---|
| AVAILABLE COUNT | 0 | 1 |

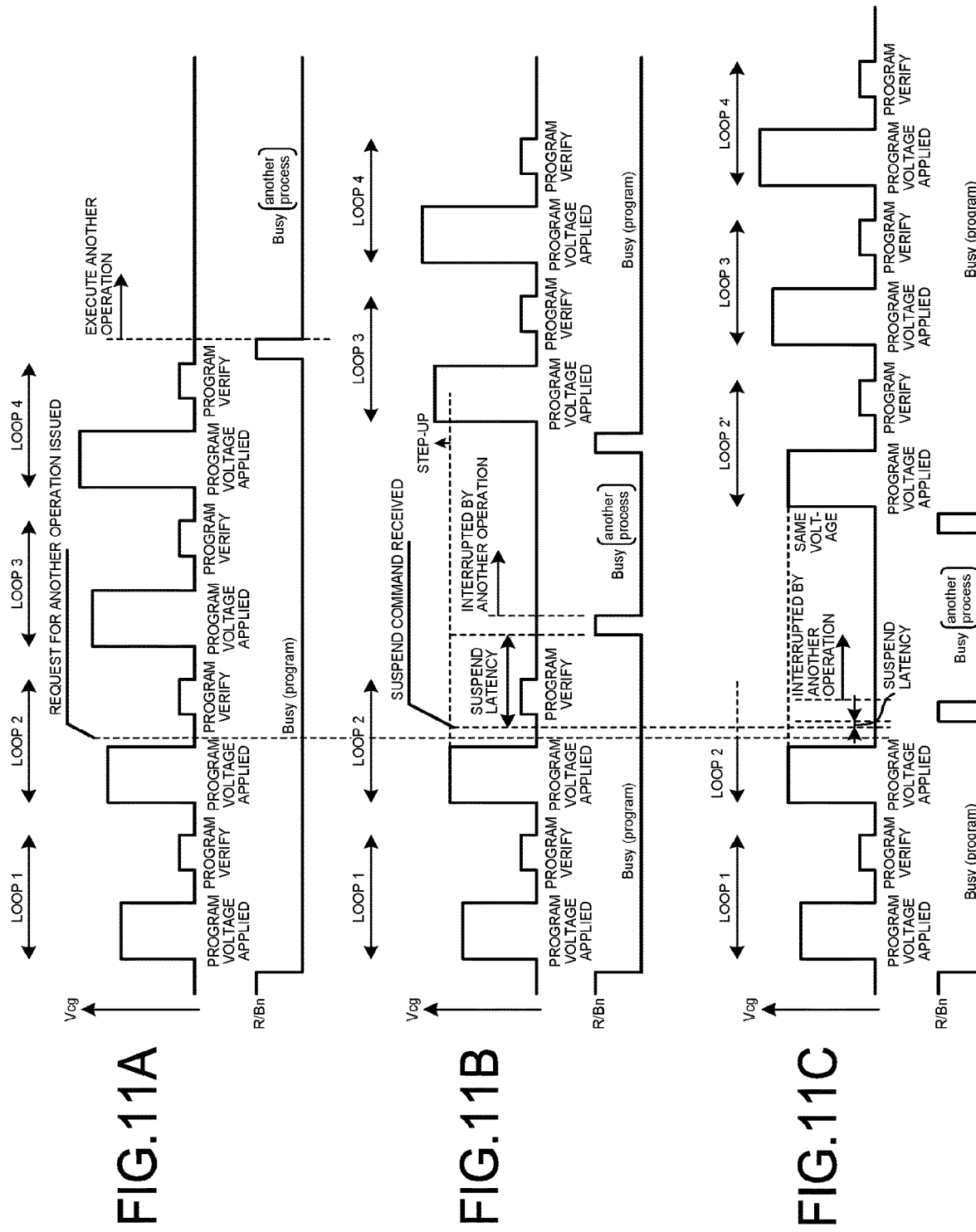

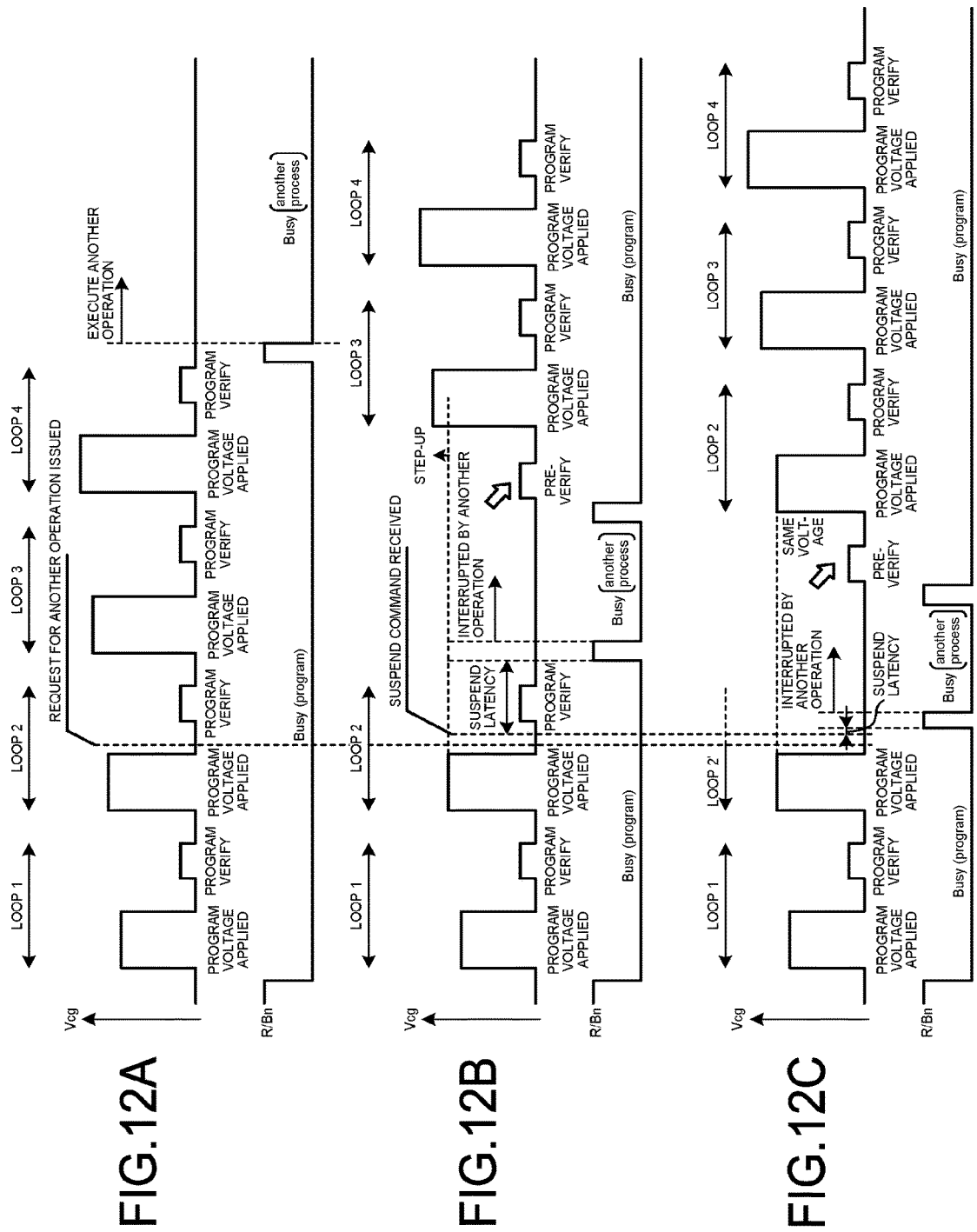

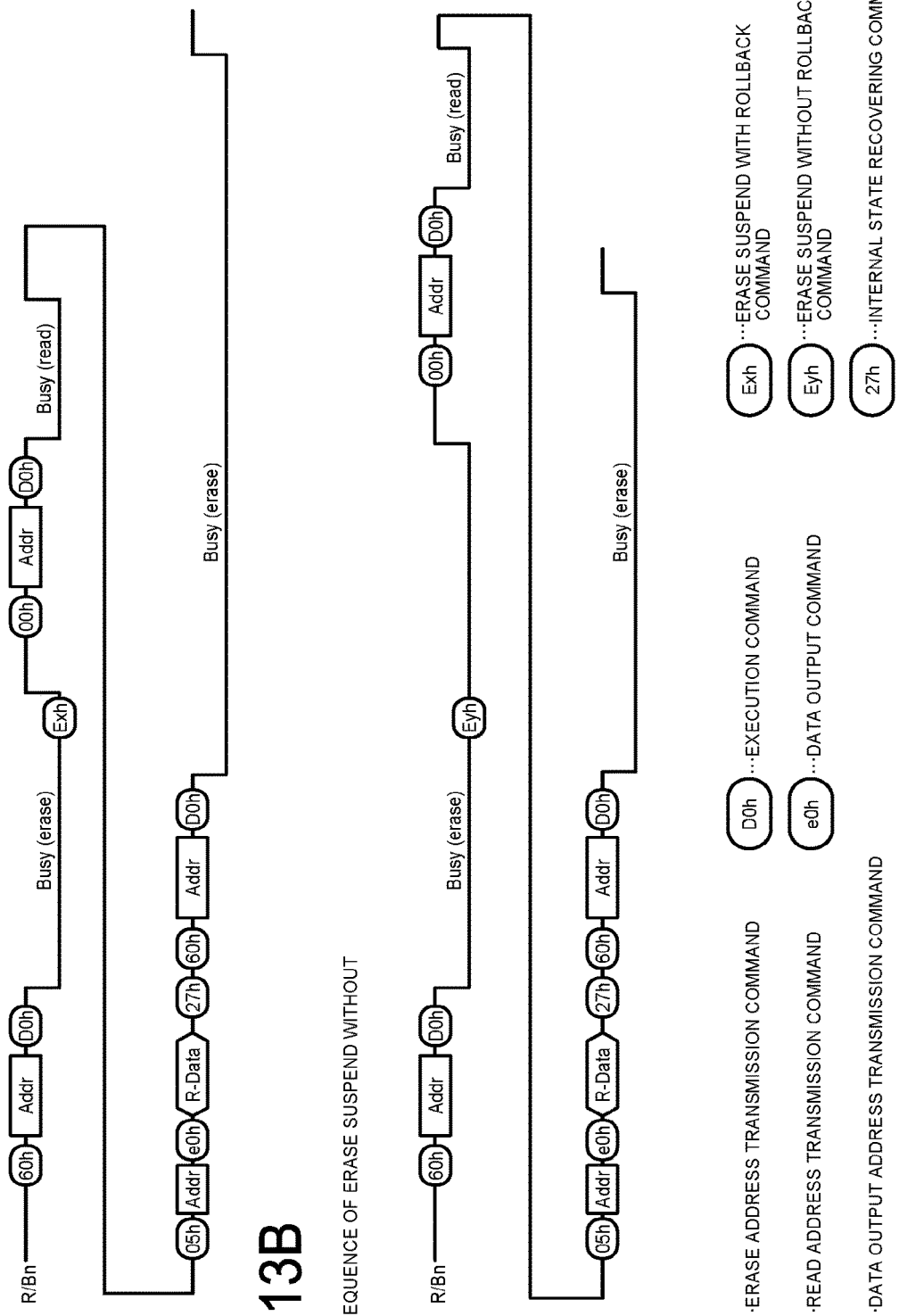

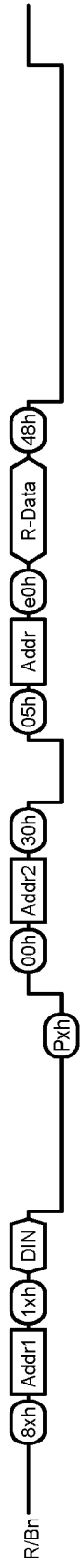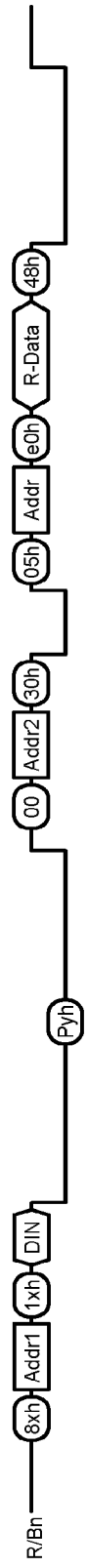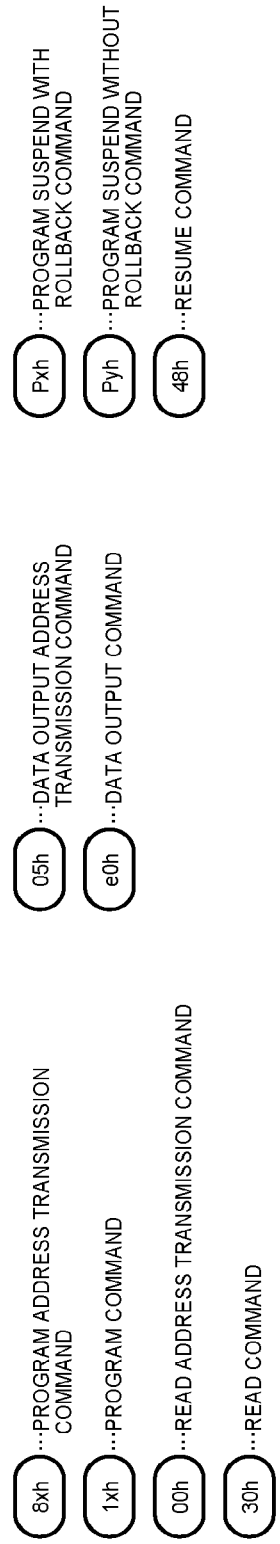

FIG.20

ERASE-SUSPEND PLAN TABLE 14j

| NUMBER OF ERASED BLOCKS | BUDGET COUNT OF ERASE SUSPEND WITH ROLLBACK | BUDGET COUNT OF ERASE SUSPEND WITHOUT ROLLBACK |
|---|---|---|
| 3 | 2 | 0 |
| 2 | $N+\Delta$ | 1 |
| 1 | 0 | $N+\Delta$ |
| 0 | 0 | 1 |

FIG.21

PLAN ADJUSTMENT TABLE BASED ON WRITE QD 14k

| AVERAGE VALUE OF WRITE QD | ADJUSTMENT VALUE |
|---|---|
| 0 | 1 |
| 1 to 2 | 0 |
| 3 or over | -1 |

FIG.22

PLAN ADJUSTMENT TABLE BASED ON
NUMBER OF PROGRAM/ERASE CYCLES  ⸺14l

| NUMBER OF PROGRAM/ERASE CYCLES | ADJUSTMENT VALUE |
|---|---|
| 0 to 300 | 0 |
| 300 to 500 | -1 |
| 500 or over | -2 |

FIG.23

PLAN ADJUSTMENT TABLE BASED ON
ISSUANCE RATIO OF READ REQUEST  ⸺14m

| NUMBER OF READ REQUESTS/TOTAL NUMBER OF READ REQUESTS AND WRITE REQUESTS | ADJUSTMENT VALUE |
|---|---|
| 1 | 2 |
| 0.5 to 1 | 1 |
| 0 to 0.5 | -1 |

FIG.24

PLAN ADJUSTMENT TABLE BASED ON WRITE QD AND ISSUANCE RATIO OF READ REQUEST

14n

| AVERAGE VALUE OF WRITE QD | NUMBER OF READ REQUESTS / TOTAL NUMBER OF READ REQUESTS AND WRITE REQUESTS | ADJUSTMENT VALUE |
|---|---|---|
| 0 | 1 | 3 |
| 0 | 0.5 to 1 | 1 |
| 0 | 0 to 0.5 | 1 |
| 1 to 2 | 1 | 2 |
| 1 to 2 | 0.5 to 1 | 2 |
| 1 to 2 | 0 to 0.5 | 1 |
| 3 or over | 1 | 1 |
| 3 or over | 0.5 to 1 | 0 |
| 3 or over | 0 to 0.5 | -1 |

FIG.25A

NUMBER OF ISSUED COUNT OF PROGRAM SUSPEND WITHOUT ROLLBACK / NUMBER OF ISSUED COUNT OF PROGRAM SUSPEND WITH ROLLBACK

|   | 0 | 1 | 2 | 3 | 4 |
|---|---|---|---|---|---|
| 0 | 1 | 1 | 1 | 1 | 0 |
| 1 | 1 | 1 | 1 | 1 | 0 |
| 2 | 1 | 1 | 0 | 0 | 0 |
| 3 | 1 | 0 | 0 | 0 | 0 |
| 4 | 0 | 0 | 0 | 0 | 0 |

FIG.25B

NUMBER OF ISSUED COUNT OF PROGRAM SUSPEND WITHOUT ROLLBACK / NUMBER OF ISSUED COUNT OF PROGRAM SUSPEND WITH ROLLBACK

|   | 0 | 1 | 2 | 3 | 4 |
|---|---|---|---|---|---|
| 0 | 1 | 1 | 1 | 1 | 0 |
| 1 |   | ① | 1 | 1 | 0 |
| 2 | 1 | 1 | 0 | 0 | 0 |
| 3 | 1 | 0 | 0 | 0 | 0 |
| 4 | 0 | 0 | 0 | 0 | 0 |

FIG.25C

NUMBER OF ISSUED COUNT OF PROGRAM SUSPEND WITHOUT ROLLBACK / NUMBER OF ISSUED COUNT OF PROGRAM SUSPEND WITH ROLLBACK

|   | 0 | 1 | 2 | 3 | 4 |
|---|---|---|---|---|---|
| 0 | 1 | 1 | 1 | 1 | 0 |
| 1 | 1 | 1 | 1 | 1 | 0 |
| 2 |   |   | 0 | ⓪ | 0 |
| 3 | 1 | 0 | 0 | 0 | 0 |
| 4 | 0 | 0 | 0 | 0 | 0 |

FIG.25D

NUMBER OF ISSUED COUNT OF PROGRAM SUSPEND WITHOUT ROLLBACK / NUMBER OF ISSUED COUNT OF PROGRAM SUSPEND WITH ROLLBACK

|   | 0 | 1 | 2 | 3 | 4 |
|---|---|---|---|---|---|
| 0 | 1 | 1 | 1 | 1 | 0 |
| 1 | 1 | 1 | 1 | 0 | 0 |
| 2 | 1 | 1 | 0 | 0 | 0 |
| 3 | 1 | 0 | 0 | 0 | 0 |
| 4 | 0 | 0 | 0 | 0 | 0 |

FIG.26

ERASE-SUSPEND AVAILABLE COUNT
SETTING TIME

| NEXT SETTING TIME | SETTING INTERVAL |
|---|---|
| t1 | P |

14o

MEMORY SYSTEM AND NONVOLATILE MEMORY

CROSS-REFERENCE TO RELATED APPLICATION

This application is based upon and claims the benefit of priority from Japanese Patent Application No. 2018-180145, filed on Sep. 26, 2018, the entire contents of which are incorporated herein by reference.

FIELD

Embodiments described herein relate generally to a memory system and a nonvolatile memory.

BACKGROUND

Along with progress of high-capacity, nonvolatile NAND flash memories, memory systems such as a solid state drive (SSD) incorporating such NAND flash memories have been attracting attention.

During execution of a preceding erase operation or program operation, such an SSD may execute another operation in response to a request from a host. In such a case the SSD may need to determine which one of the erase operation or the program operation and said another operation is given priority.

BRIEF DESCRIPTION OF THE DRAWINGS

FIG. 3 is a diagram illustrating an example of an erase-suspend plan table of a memory controller according to the embodiment;

FIG. 4 is a diagram illustrating an example of a currently available count of erase-suspend of the memory controller according to the embodiment;

FIG. 5 is a diagram illustrating an example of a program-suspend plan table of the memory controller according to the embodiment;

FIG. 6 is a diagram illustrating an example of a currently available count of program-suspend of the memory controller according to the embodiment;

FIG. 11A is a diagram illustrating an exemplary timing chart of voltage-application during a program operation in the NAND memory according to the embodiment;

FIG. 11B is a diagram illustrating an exemplary timing chart of voltage-application during a program operation of the NAND memory according to the embodiment;

FIG. 11C is a diagram illustrating an exemplary timing chart of voltage-application during a program operation of the NAND memory according to the embodiment;

FIG. 12A is a diagram illustrating another exemplary timing chart of the voltage-application during the program operation of the NAND memory according to the embodiment;

FIG. 12B is a diagram illustrating still another exemplary timing chart of the voltage-application during the program operation of the NAND memory according to the embodiment;

FIG. 12C is a diagram illustrating still another exemplary timing chart of the voltage application during the program operation of the NAND memory according to the embodiment;

FIG. 13A is a diagram illustrating an exemplary erase-suspend command sequence in the memory system according to the embodiment;

FIG. 13B is a diagram illustrating another exemplary erase-suspend command sequence in the memory system according to the embodiment;

FIG. 14A is a diagram illustrating an exemplary program-suspend command sequence in the memory system according to the embodiment;

FIG. 14B is a diagram illustrating another exemplary program-suspend command sequence in the memory system according to the embodiment;

FIG. 20 is a diagram illustrating an exemplary erase-suspend plan table of a memory controller according to a first modification of the embodiment;

FIG. 21 is a diagram illustrating an exemplary plan adjustment table based on a write queue depth (QD) of the memory controller according to the first modification of the embodiment;

FIG. 22 is a diagram illustrating an exemplary plan adjustment table based on the number of program/erase cycles, which is stored in the memory controller according to a second modification of the embodiment;

FIG. 23 is a diagram illustrating an exemplary plan adjustment table based on a read request issuance ratio of a memory controller according to a third modification of the embodiment;

FIG. 24 is a diagram illustrating an exemplary plan adjustment table of a memory controller according to a fifth modification of the embodiment;

FIG. 25A is a diagram illustrating an exemplary program-suspend limitation table of a memory controller according to a sixth modification of the embodiment;

FIG. 25B is a diagram illustrating the exemplary program-suspend limitation table of the memory controller according to the sixth modification of the embodiment;

FIG. 25C is a diagram illustrating the exemplary program-suspend limitation table of the memory controller according to the sixth modification of the embodiment;

FIG. 25D is a diagram illustrating the exemplary program-suspend limitation table of the memory controller according to the sixth modification of the embodiment;

FIG. 26 is a diagram illustrating an exemplary erase-suspend-available count setting time of a memory controller according to a seventh modification of the embodiment;

DETAILED DESCRIPTION

In general, according to one embodiment, A memory system includes a nonvolatile memory, and a memory controller that controls operation of the nonvolatile memory. The nonvolatile memory is configured to receive, from the memory controller, a first command for execution of at least one of an erase operation and a program operation; in response to receiving a second command from the memory controller during execution of a first operation requested by the first command, execute a second operation for suspending the first operation before the first operation reaches a given section; and in response to receiving a third command from the memory controller during the first operation, suspend the first operation after the given section.

Exemplary embodiments will be described in detail with reference to the accompanying drawings. The following embodiments are not intended to limit the scope of the present invention. The following embodiments include some constituent elements substantially the same or easily conceivable by skilled person. In this specification, suspend operation(s) or suspend command(s) may be simply referred to as suspend(s).

Exemplary Configuration of Memory System

Figure 1:
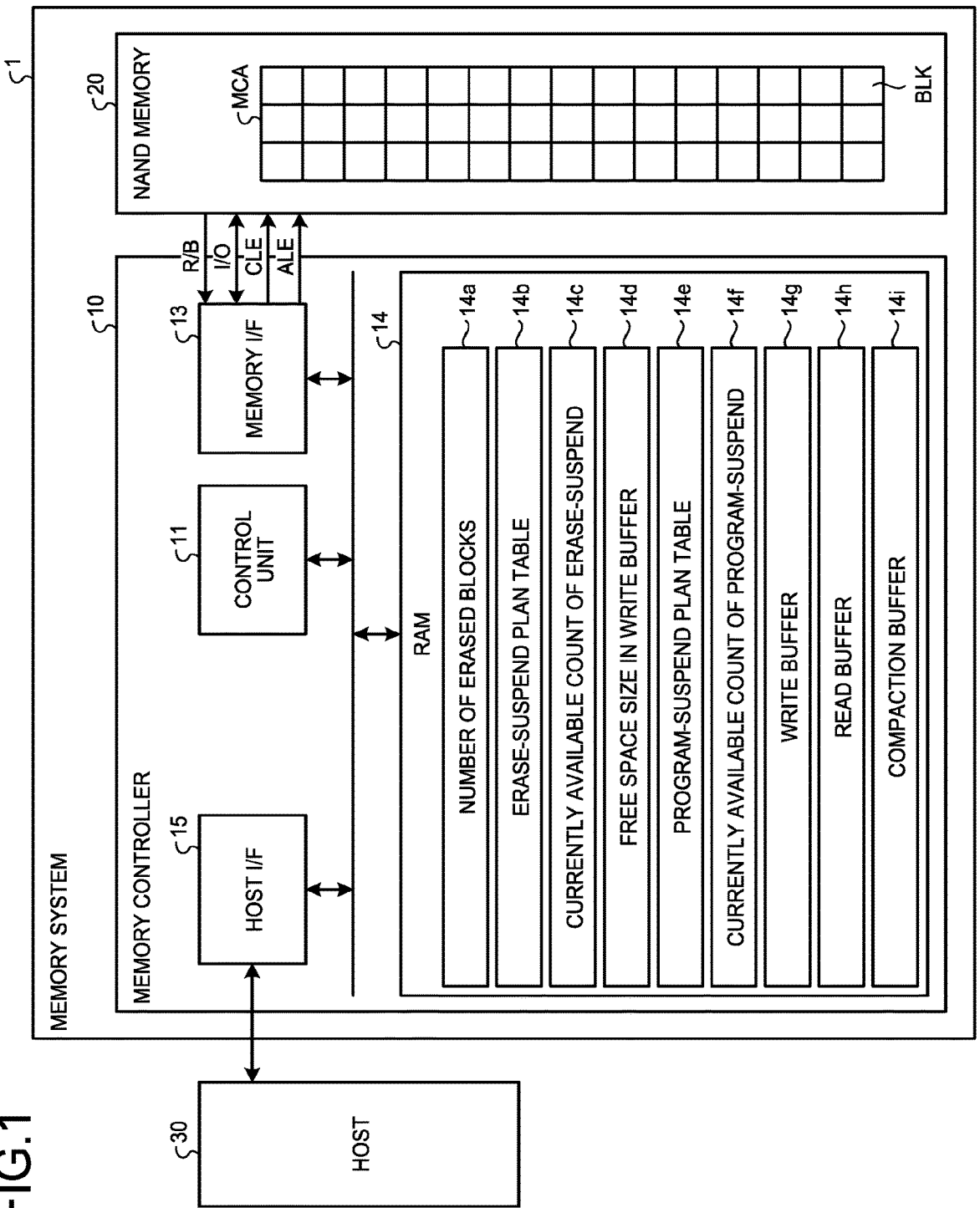
FIG. 1 is a block diagram illustrating an exemplary schematic configuration of a memory system according to an embodiment.

FIG. 1 is a block diagram illustrating an exemplary schematic configuration of a memory system 1 according to an embodiment. As illustrated in FIG. 1, the memory system 1 includes a memory controller 10, a NAND flash memory 20 (hereinafter, referred to simply as a NAND memory 20) being a nonvolatile memory.

The memory system 1 may be, for example, a memory card that includes the memory controller 10 and the NAND memory 20 in one package, or a solid state drive (SSD). The memory system 1 is connectable to a host 30. The host 30 may be, for example, an information processing device such as a personal computer, a server, and a storage box, a portable telephone, or an imaging device. The host 30 may be a portable terminal such as a tablet computer and a smartphone, a game machine, or an in-vehicle terminal such as a car navigation system.

The NAND memory 20 is a nonvolatile memory that stores data in a nonvolatile manner. The NAND memory 20 may include a plurality of memory chips. The following will describe an example of the NAND memory as a nonvolatile memory, but the nonvolatile memory is not limited to such an example. Examples of the nonvolatile memory include various storage media such as a NOR flash memory, a three-dimensional flash memory, a resistance random access memory (ReRAM), and a ferroelectric random access memory (FeRAM). It is not essential for the nonvolatile memory to be a semiconductor memory, and the embodiment is also applicable to various storage media in addition to the semiconductor memory.

The NAND memory 20 includes a memory cell array MCA of a plurality of memory cells arranged in matrix. The memory cell array MCA includes a plurality of blocks BLK, each of which includes a plurality of memory cells. Data from the host 30 is stored in the memory cell array MCA in a nonvolatile manner. Details of the NAND memory 20 will be described with reference to FIG. 2.

Figure 2:
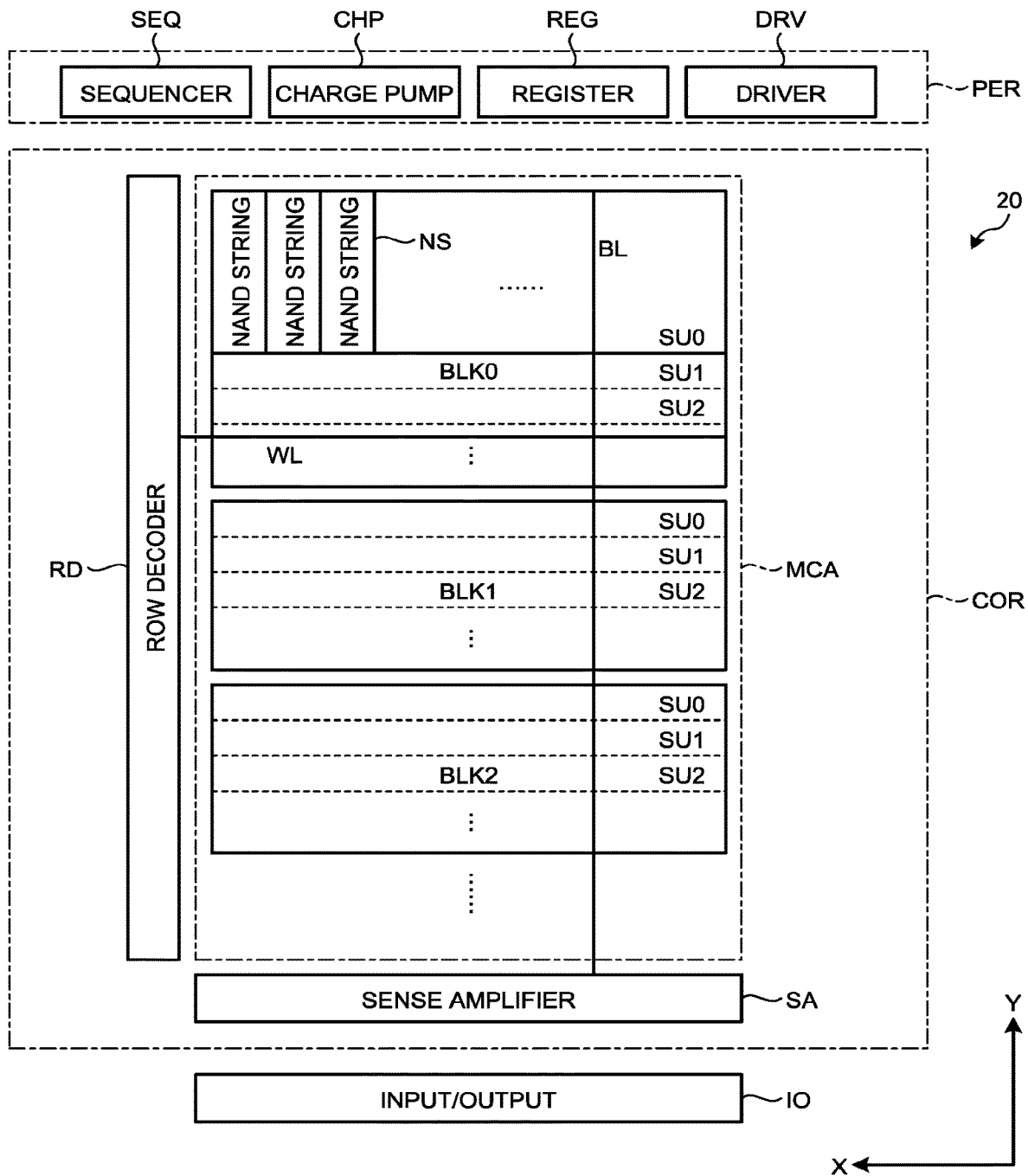
FIG. 2 is a block diagram of a NAND memory according to the embodiment.

FIG. 2 is a block diagram of the NAND memory 20 according to the embodiment. As illustrated in FIG. 2, the NAND flash memory 20 includes a core COR, an input/output IO, and a peripheral circuit PER.

The core COR includes the memory cell array MCA, a row decoder RD, and a sense amplifier SA.

The memory cell array MCA includes blocks BLK (BLK0, BLK1, BLK2, ... ) as assemblies of nonvolatile memory cells. Each of the blocks BLK includes a plurality of string units SU (SU0, SU1, SU2, ... ) being assemblies of NAND strings NS in which memory cells are connected in series. The number of blocks in the memory cell array MCA and the number of string units and the number of NAND strings in each block BLK are optionally set.

As described above, in each of the NAND strings NS, memory cells are connected in series. In the same string unit SU, $n^{th}$ memory cells in the NAND strings NS are connected to the same word line WL extending in an X direction. In the blocks BLK, $m^{th}$ NAND strings NS are connected to the same bit line BL extending in a Y direction. Thus, the memory cells are disposed at intersections of word lines WL and bit lines BL.

The NAND memory 20 is typically subjected to an erase operation in a unit of a block BLK, and to program and read operations in a unit of a page. In this embodiment, the memory cells connected to the same word line are referred to as a memory cell group. In the case of the memory cells being single level cells (SLC) each storing one bit, one memory cell group corresponds to one page. In the case of the memory cells being multiple level cells (MLC) each storing a multi-value (two or more bit data), one memory cell group corresponds to multiple pages. Each memory cell is identifiable by the address of the word line and the address of the bit line.

The row decoder RD receives a block address from the memory controller 10, decodes the block address, and selects a block BLK and a word line WL designated by the block address.

In a data read operation, the sense amplifier SA senses and amplifies data read from the memory cell. The sense amplifier SA outputs the read data to the memory controller 10 as necessary. In a data program operation, the sense amplifier SA receives write data from the memory controller 10 and transmits it to the memory cell.

The input/output IO transmits and receives various commands or various items of data to and from the memory controller 10.

The peripheral circuit PER includes a sequencer SEQ, a charge pump CHP, a register REG, and a driver DRV.

The driver DRV supplies, to the row decoder RD and the sense amplifier SA, a voltage necessary for programming, reading, and erasing data. The voltage is applied to the interconnections of the memory cell array MCA. The charge pump CHP raises a power supply voltage supplied from an exterior to supply a required voltage to the driver DRV. The register REG stores a variety of signals. For example, the register REG stores a status of a data program operation or an erase operation to thereby notify the memory controller 10 of normal completion or non-normal completion of the operation. The sequencer SEQ controls the overall operation of the NAND memory 20.

The memory controller 10 as illustrated in FIG. 1 is, for example, a semiconductor integrated circuit such as a system-on-a-chip (SoC). The memory controller 10 may include a field-programmable gate array (FPGA) or an application specific integrated circuit (ASIC). The memory controller 10 controls a data write operation to the NAND memory 20 in accordance with a write request from the host 30. The memory controller 10 controls a data read operation to the NAND memory 20 in accordance with a read request from the host 30.

The memory controller 10 includes a control unit 11, a memory interface (memory I/F) 13, a RAM 14, and a host interface (host I/F) 15. The control unit 11, the memory I/F 13, the RAM 14, and the host I/F 15 are connected to one another via an internal bus.

The host I/F 15 performs processing in compliance with an interface standard such as serial-attached SCSI (SAS; registered trademark), serial ATA (SATA; registered trademark), PCI express (PCIe; registered trademark), and NVM express (NVMe; registered trademark). The host I/F 15 receives a request and write target data, i.e., user data from the host 30, and outputs them to the internal bus. In addition, the host I/F 15 transmits data (user data) read from the NAND memory 20 and a response from the control unit 11 to the host 30. The control unit 11, as described later, may achieve part or all of the functions of the host I/F 15. That is, the control unit 11 may directly exchange information with the host 30.

The memory I/F 13 exchanges various signals including a ready busy signal R/B, an input/output signal I/O, a command latch enable signal CLE, and an address latch enable signal ALE with the NAND memory 20 in accordance with an instruction from the control unit 11. The ready busy signal R/B indicates a ready state or a busy state of the NAND memory 20 as to whether to be able to receive a command from the memory controller 10. The input/output signal I/O represents actual data that is transmitted and received between the NAND memory 20 and the memory controller 10, and is an eight-bit signal indicating a command, an address, write data, or read data. The command latch enable signal CLE serves to notify the NAND memory 20 of the input/output signal I/O being a command. The address latch enable signal ALE serves to notify the NAND memory 20 of the input signal I/O being an address.

Through transmission and reception of the signals, the memory I/F 13 performs a data program operation or a data erase operation to the NAND memory 20 in response to an instruction from the control unit 11. The memory I/F 13 performs a data read operation to the NAND memory 20 in accordance with an instruction from the control unit 11. The control unit 11 may achieve part or all of the functions of the memory I/F 13, as described later. That is, the control unit 11 may directly exchange information with the NAND memory 20.

The control unit 11 is, for example, a central processing unit (CPU). The control unit 11 operates in accordance with a firmware program. The firmware program is pre-stored in the NAND memory 20, for example, during manufacturing or at the time of shipping of the memory system 1. Upon startup of the memory system 1, the control unit 11 loads the firmware program from the NAND memory 20 onto the RAM 14 of the memory controller 10. The control unit 11 implements various functions by executing the firmware program loaded to the RAM 14.

As described above, the CPU implements part or all of the functions of the control unit 11 by executing, for example, firmware. In place of the CPU that executes a firmware, a hardware circuit may implement the part or all of the functions of the control unit 11.

The control unit 11 controls the elements of the memory system 1 as a whole. In response to receipt of a request from the host 30 through the host I/F 15, the control unit 11 performs control according to the request. For example, the control unit 11 instructs the memory I/F 13 to program data to the NAND memory 20 according to a write request from the host 30. The control unit 11 instructs the memory I/F 13 to read data from the NAND memory 20 according to a read request from the host 30. The control unit 11 instructs the memory I/F 13 to erase data from the NAND memory 20.

In response to receipt of a write request from the host 30, the control unit 11 determines a region in the memory cell array MCA, being a storage region in the NAND memory 20, for data stored in a write buffer 14g, as described later. That is, the control unit 11 manages a write destination of data. The control unit 11 manages also an address conversion table containing corresponding information between a logical address of data received from the host 30 and a physical address indicating the storage region of the data in the NAND memory 20.

There may be a time lag from receipt of the write request by the memory controller 10 from the host 30 to an actual program operation to the NAND memory 20. In this lag period, the write buffer 14g serves to temporarily store data according to the write request from the host 30. For example, the data program operation to the NAND memory 20 is implemented by a flush operation for non-volatilization of data accumulated in the write buffer 14g.

In response to receipt of a read request from the host 30, the control unit 11 converts a logical address designated by the read request into a physical address, referring to the address conversion table, and instructs the memory I/F 13 to read data from the physical address.

Without a request from the host 30, for example, the control unit 11 may instruct the memory I/F 13 to perform an erase or a program operation to the NAND memory 20. Examples of the erase and program operations irrespective of requests from the host 30 include a refresh operation in which error-corrected data is rewritten for maintenance of stored data, a wear leveling in which data is transcribed among blocks BLK to equalize, among the blocks BLK, the number of the program and erase operations performed on each block BLK, which is managed by the memory controller 10, and a garbage collection (i.e., compaction) in which data is aggregated into a certain block BLK to allocate programmable blocks BLK. After the refresh operation, the wear leveling, and the compaction, the block BLK as a source of data transfer is subjected to an erase operation. As described above, the erase operation is performed, for example, in a unit of a block BLK, and thus it may take a longer length of time to complete the erase operation.

During at least either the erase operation or the program operation of the NAND memory 20, the control unit 11 may need to execute another operation, for example, in response to a request from the host 30. In such a case, the control unit 11 determines priority between the preceding operation and said another operation. In this embodiment, "necessity to execute another operation" and "occurring of a request for another operation" are considered the same meaning.

More specifically, in the case of the NAND memory 20 including one or more memory chips, during a preceding operation to a certain memory chip, a situation may arises that the control unit 11 is to perform another operation to the same memory chip. In such a situation, the control unit 11 determines which one of the preceding operation and said another operation is to be preferentially performed. Execution of another operation is required, for example, in response to issuance of a read command from the host 30 or the memory controller 10 extracting a read command from the host 30 from a command queue (that is, occurrence of a read request) during erase operation or during program operation. A program request may occur in response to a request from the host 30 during erase operation.

When giving high priority to a preceding operation such as erase operation and program operation, the control unit 11 does not suspend but completes the preceding operation and then causes the NAND memory 20 to perform another operation such as the one in response to a request from the host 30. Hereinafter, such operation by the NAND memory 20 may be referred to as a no-suspend operation. When giving high priority to another operation such as an operation in response to a request from the host 30, the control unit 11 issues a suspend command to the NAND memory 20 to suspend the preceding operation. Examples of suspending the preceding operation include suspend with rollback and suspend without rollback.

The suspend with rollback represents an operation in which the NAND memory 20 is caused to suspend the preceding operation before proceeding to a given section of the preceding operation. The suspended preceding operation is resumed after the NAND memory 20 completes a given operation in accordance with a request, for example, from the host 30. In the suspend with rollback, the preceding operation may be returned back from the point it was suspended, and resumed. Thus, the operation may become redundant.

The suspend without rollback represents an operation in which the NAND memory 20 is caused to proceed to a given section of the preceding operation and then suspend the preceding operation. The suspended preceding operation is resumed after the NAND memory 20 completes a given operation in accordance with a request, for example, from the host 30. In the suspend without rollback, the preceding operation is resumed, without rollback of part of the operation, from the operation subsequent to the point it was suspended. In other words, the given section of the preceding operation represents suspendable timing without rollback. The given section will be described later in detail.

A selection between the suspend with rollback and the suspend with rollback are made depending on the state of the NAND memory 20 and amount of allowable delay in the preceding operation (erase operation or program operation). When the state of the NAND memory 20 allows a delay in erase operation or program operation, the suspend with rollback is selected. When the state of the NAND memory 20 cannot allow a delay in erase operation or program operation, the suspend without rollback is selected. Depending on the state of the NAND memory 20, neither the suspend with rollback nor the suspend without rollback may be selected. The relationship between the state of the NAND memory 20 and selection between the suspend with rollback and the suspend without rollback will be described in detail later.

Examples of the RAM 14 include general-purpose memories such as a static random access memory (SRAM) and a dynamic random access memory (DRAM). The RAM 14 can be used for a work area of the control unit 11 being a CPU, for example.

The RAM 14 includes the write buffer 14g that temporarily stores data received from the host 30 by the memory controller 10 until storing the data into the NAND memory 20. The RAM 14 further includes a read buffer 14h that temporarily stores data read from the NAND memory 20 until transmitting the data to the host 30. In addition, the RAM 14 includes a compaction buffer 14i that temporarily stores data in a compaction operation of the NAND memory 20. The compaction buffer 14i serves as temporary data storage also during refresh operation and wear leveling, for example.

The RAM 14 stores management data. The management data refers to data for use in the memory system 1 for management purpose. For example, the management data includes a number of erased blocks 14a, an erase-suspend plan table 14b, an currently available count of erase-suspend 14c, a free space size in write buffer 14d, a program-suspend plan table 14e, and a currently available count of program-suspend 14f. The number of erased blocks 14a contains the number of data-erased blocks BLK, among the blocks BLK of the NAND memory 20. The free space size in write buffer 14d contains a free space in the write buffer 14g in the RAM 14. The memory controller 10 refers to the erase-suspend plan table 14b, the currently available count of erase-suspend 14c, the program-suspend plan table 14e, and the currently available count of program-suspend 14f, for determining whether to issue a suspend command to the NAND memory 20.

FIG. 3 is a diagram illustrating an example of the erase-suspend plan table 14b of the memory controller 10 according to the embodiment.

As illustrated in FIG. 3, the erase-suspend plan table 14b lists the budget counts of suspends with rollback and suspends without rollback when the number of erased blocks is 3, 2, 1, and 0. For example, the numerical values in the erase-suspend plan table 14b are set at the time of shipping of the memory system 1. The number of erased blocks, and the budget count of suspends associated with the budget count of suspends in FIG. 3 are merely exemplary. The memory controller 10 refers to the erase-suspend plan table 14b when causing the NAND memory 20 to erase data from a given block BLK as a preceding operation. The memory controller 10 determines the number of erase-suspends to be executed on the basis of the erase-suspend plan table 14b.

For example, with a sufficiently large number of erased blocks, some delay in an erase operation may not matter. Thus, either of the suspend with rollback and the suspend without rollback is selected, and another operation is preferentially executed. Which one of the suspend with rollback and the suspend without rollback is selected depends on the number of erased blocks. With a larger number of erased blocks, the suspend with rollback is selected. As the number of erased blocks decreases, the suspend without rollback and no suspend are selected to avoid delay in erase operation as much as possible. The exemplary relationship among the numbers of erased blocks, and budget counts of suspends with rollback and budget counts of suspends without rollback in FIG. 3 shows that along with a decrease in the number of erased blocks, delay in the erase operation is less permitted.

FIG. 4 is a diagram illustrating an example of the currently available count of erase-suspend 14c of the memory controller 10 according to the embodiment.

As illustrated in FIG. 4, the currently available count of erase-suspend 14c stores numerical values based on the budget count of suspends as shown in the erase-suspend plan table 14b. When causing the NAND memory 20 to perform an erase operation, the memory controller 10 obtains the budget counts of suspends with rollback and suspends without rollback from the erase-suspend plan table 14b and registers them in the items of suspend with rollback and suspend without rollback of the currently available count of erase-suspend 14c. Upon each execution of the suspend with rollback and the suspend without rollback, the registered numbers of suspends with rollback and suspends without rollback in the currently available count of erase-suspend 14c are reduced.

FIG. 5 is a diagram illustrating an example of the program-suspend plan table 14e of the memory controller 10 according to the embodiment.

As illustrated in FIG. 5, the program-suspend plan table 14e contains the budget counts of suspends with rollback and suspends without rollback corresponding to the free space of the write buffer (WB) 14g, i.e., 70 to 100, 50 to 70, 30 to 50, and 0 to 30. For example, the numerical values in the program-suspend plan table 14e are set at the time of shipping the memory system 1. The numeral values of the free space of the write buffer 14g, and the budget counts associated with the respective numerical values in FIG. 5 are merely exemplary. The unit of the free space of the write buffer 14g is 4-KB entries i.e., data storage regions. The memory controller 10 refers to the program-suspend plan table 14e when causing the NAND memory 20 to perform a program operation to a given block BLK as a preceding operation. The memory controller 10 determines the number of program suspends to be executed on the basis of the program-suspend plan table 14e.

For example, with a sufficiently large free space in the write buffer 14g, some delay in a program operation does not matter. Thus, either of the suspend with rollback and the suspend without rollback is selected, and another operation is preferentially executed. Which one of the suspend with rollback and the suspend without rollback is selected depends on the free space of the write buffer 14g. With a larger free space in the write buffer 14g, the suspend with rollback is selected. As the free space of the write buffer 14g decreases, the suspend without rollback and no suspend are selected to avoid delay in a program operation as much as possible. The exemplary relationship among the numerical values of the free space of the write buffer 14g, and the budget counts of suspends with rollback and suspends without rollback in FIG. 5 shows that along with decrease in the free space of the write buffer 14g, delay in program operation is less permitted.

FIG. 6 is a diagram illustrating an example of the currently available count of program-suspend 14f of the memory controller 10 according to the embodiment.

As illustrated in FIG. 6, the currently available count of program-suspend 14f stores numerical values based on the budget counts in the program-suspend plan table 14e. When causing the NAND memory 20 to perform a program operation, the memory controller 10 obtains the budget counts of suspends with rollback and suspends without rollback from the program-suspend plan table 14e and registers them in the items of suspend with rollback and suspend without rollback of the currently available count of program-suspend 14f. Then, upon each execution of the suspend with rollback and the suspend without rollback, the registered numbers of suspends with rollback and suspends without rollback in the currently available count of program-suspend 14f are reduced.

Exemplary Functional Configuration of Control Unit

Figure 7:
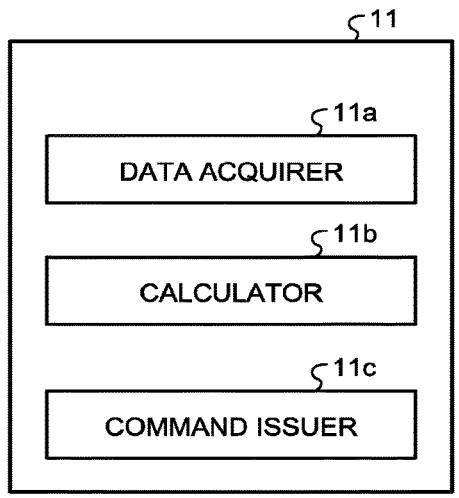
FIG. 7 is a diagram illustrating a functional block of a control unit of the memory controller according to the embodiment.

FIG. 7 is a diagram illustrating a functional block of the control unit 11 of the memory controller 10 according to the embodiment. As illustrated in FIG. 7, for example, the control unit 11 includes functions, which are to be implemented by firmware that the CPU executes, of a data acquirer 11a, a calculator 11b, and a command issuer 11c. By such functional elements, the control unit 11 controls suspend of a preceding operation of the NAND memory 20, for example.

The data acquirer 11a acquires the number of data-erased blocks among the blocks BLK of the NAND memory 20, and stores the number in the number of erased blocks 14a. The number of erased blocks represents, for example, the number of blocks BLK erased for the next program operation among the blocks BLK that includes no valid data through an executed compaction, for example.

The write buffer 14g temporarily stores data to be programmed to the NAND memory 20. The data is associated with, for example, a received write request from the host 30. The free space in the write buffer 14g varies in accordance with the amount of the data to be programmed. The data acquirer 11a acquires the current free space of the write buffer 14g for storing in the free space size in write buffer 14d.

When causing the NAND memory 20 to perform an erase operation as a preceding operation, the calculator 11b acquires the number of erased blocks from the number of erased blocks 14a. The calculator 11b then determines the numbers of suspends with rollback and suspends without rollback to be executed with reference to the erase-suspend plan table 14b. That is, when the number of erased blocks is three, for example, the calculator 11b refers to the "number of erased blocks" item showing "3" at the top of the erase-suspend plan table 14b, and causes the command issuer 11c to issue a command so that the budget counts of suspends with rollback and suspends without rollback are two and zero, respectively.

When causing the NAND memory 20 to perform a program operation as a preceding operation, the calculator 11b acquires the free space of the write buffer 14g from the free space size in write buffer 14d. The calculator 11b determines the numbers of suspends with rollback and suspends without rollback to be executed with reference to the program-suspend plan table 14e. That is, when the free space of the write buffer 14g is 50, for example, the calculator 11b refers to "WB free space" being 30 to 50 in the program-suspend plan table 14e (the second column from the bottom), and causes the command issuer 11c to issue a command so that the budget counts of suspends with rollback and suspends without rollback are zero and two, respectively.

In response to an instruction for setting the budget counts of suspends with rollback and suspends without rollback to zero and two, respectively, for example, the command issuer 11c sets these numbers as the upper-limit numbers of suspends with rollback and suspends without rollback and issues a command. That is, the upper-limit number of the suspends with rollback is zero, and the number of issuances of the suspend with rollback command is set to zero. The upper-limit number of the suspend without rollback is two, and the number of issuances of the suspend without rollback command is set to two per erase operation, for example. After the budget counts of suspends with rollback and suspends without rollback reaching zero, the memory controller 10 issues no suspend command, does not suspend but waits for completion of a preceding operation, and then allows the NAND memory 20 to perform another operation.

Data Flow

Figure 8:
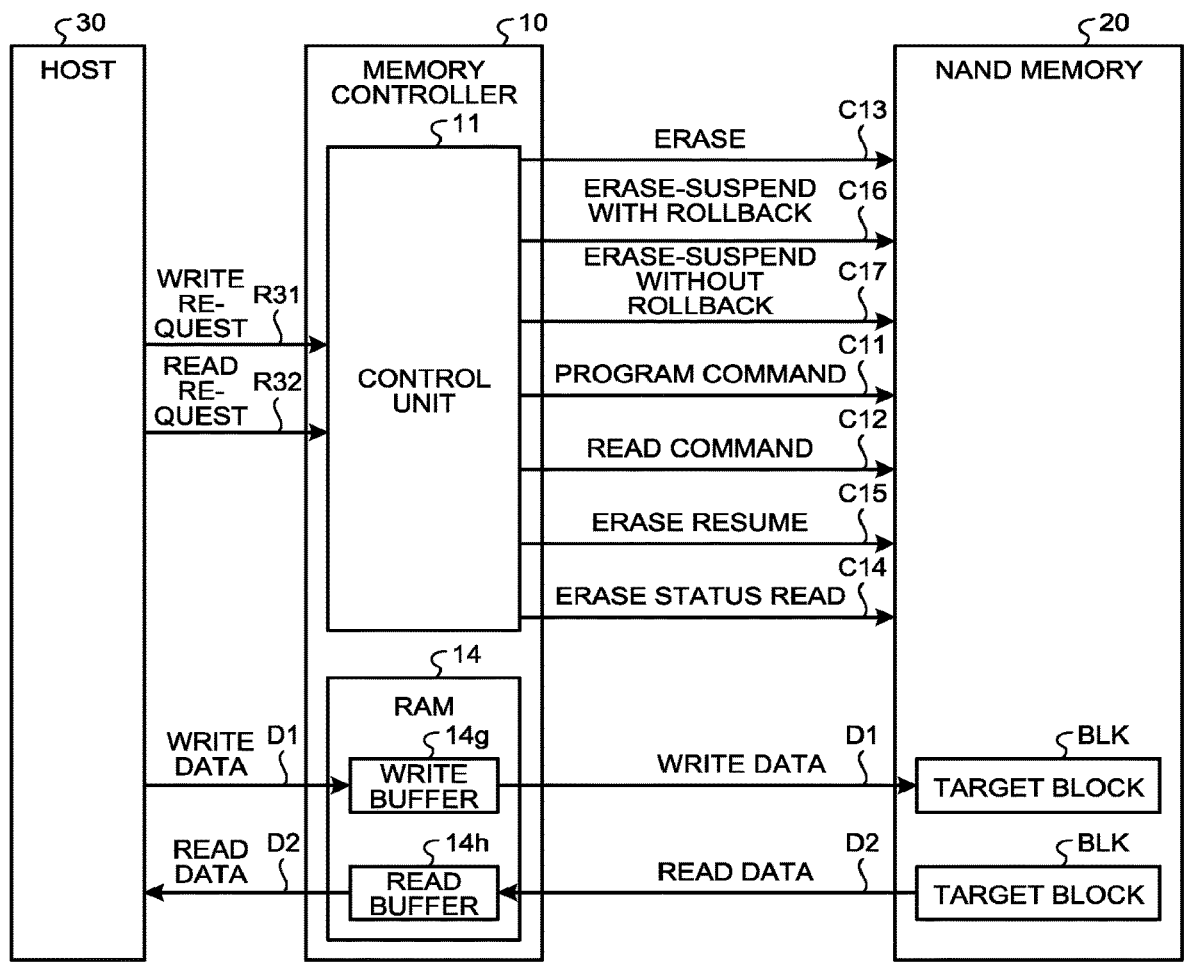
FIG. 8 is a diagram illustrating an example of a data flow among a host, the memory controller, and the NAND memory according to the embodiment.

Next, a description will be given of data flow among the host 30, the memory controller 10, and the NAND memory 20 with reference to FIG. 8 and FIG. 9. FIG. 8 is a diagram illustrating an example of a data flow among the host 30, the memory controller 10, and the NAND memory 20, according to the embodiment.

As illustrated in FIG. 8, for example, the memory controller 10 receives a write request R31 and write data D1 from the host 30, allocates a region in the write buffer 14g, temporarily stores the write data D1 in the write buffer 14g, and gives a write completion response (not shown) to the host 30. After a certain amount of write data is stored in the write buffer 14g, the memory controller 10 issues a program command C11 to the NAND memory 20. Together with the issuance of the program command C11 from the memory controller 10 to the NAND memory 20, the temporarily stored write data D1 is transferred from the write buffer 14g to the NAND memory 20, and is programmed to a program target block BLK of the NAND memory 20. After the transfer of the write data D1 to the NAND memory 20, the memory controller 10 releases the region of the write buffer 14g.

When receiving a read request R32 from the host 30, the memory controller 10 issues a read command C12 in accordance with the read request R32. In response to the issuance of the read command C12 from the memory controller 10 to the NAND memory 10, read data D2 is read from a read target block BLK of the NAND memory 20 and is temporarily stored in the read buffer 14h of the memory controller 10. The temporarily stored read data D2 is transferred from the read buffer 14h to the host 30.

The NAND memory 20 may be in an erase operation at timing at which it receives the read request R32 from the host 30. During the erase operation by an erase command C13, the NAND memory 20 returns information indicating "executing erase operation" to the memory controller 10 in response to an erase-status read command C14.

In this case, the memory controller 10 may issue either of a erase-suspend with rollback command C16 and a erase-suspend without rollback command C17, and then issue the read command C12. The NAND memory 20 suspends a the on-going erase operation and preferentially executes an operation according to a request from the host 30, and returns the read data D2 in response to the read command C12, for example.

After completion of the preferential operation to the NAND memory 20, the memory controller 10 issues an erase resume command C15 to resume the erase operation by the NAND memory 20.

Figure 9:
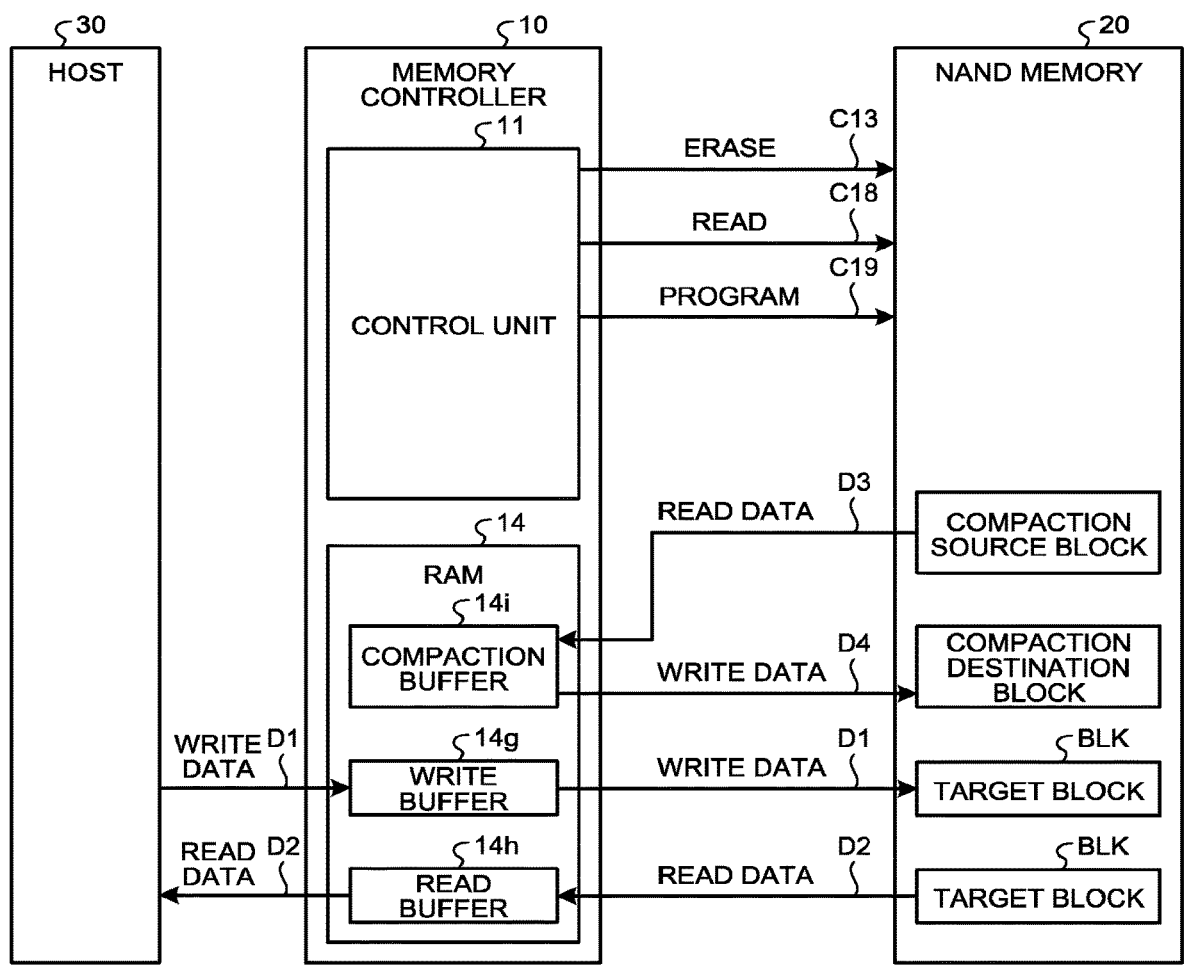
FIG. 9 is a diagram illustrating an example of a data flow between the memory controller and the NAND memory according to the embodiment.

FIG. 9 is a diagram illustrating an example of a data flow between the memory controller 10 and the NAND memory 20 according to the embodiment.

As illustrated in FIG. 9, to allocate a programmable block BLK, the memory controller 10 causes the NAND memory 20 to execute a compaction to aggregate data into a given block BLK. Receiving a read command from the memory controller 10 (C18), the NAND memory 20 reads data from a block BLK being a source of compaction (that is, compaction read). In response to a program command from the memory controller 10 (C19), the NAND memory 20 programs data to a block BLK to be compacted.

Read data D3 for the compaction is temporarily stored in the compaction buffer 14i of the memory controller 10, and transferred to the NAND memory 20 as write data D4. In a refresh operation and wear leveling, data read and program operations are performed to the NAND memory 20, and data may be temporarily stored in the compaction buffer 14i, as in the compaction.

After the compaction, the refresh operation, and the wear leveling, the block BLK from which the data has been transferred becomes a free block and thus programmable for a write request from the host 30. Receiving an erase command from the memory controller 10 (C13), the NAND memory 20 erases data from the block BLK having been a transfer source. Erase timing is preferably close, for example, to data program timing to an erase target block BLK. This makes it possible to prevent the block BLK from remaining in an erase state for a long time, which would otherwise cause data retention error, for example.

Loop in Erase and Program Operations

Figure 10A:
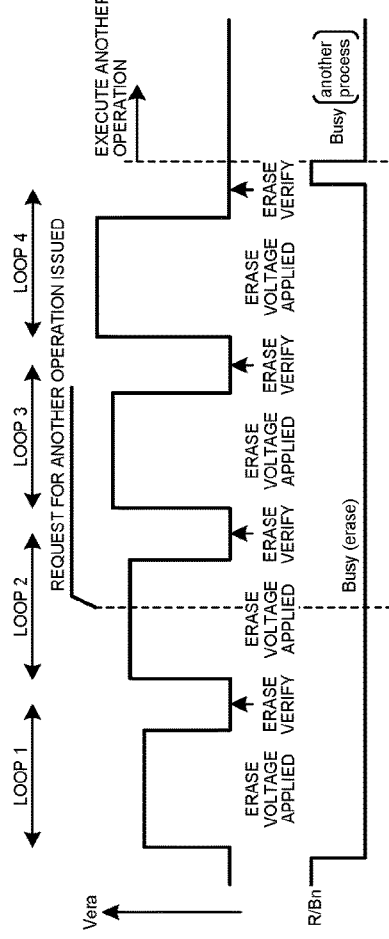
FIG. 10A is a diagram illustrating an exemplary timing chart of voltage application during an erase operation of the NAND memory according to the embodiment.

The following will describe a looped operation in the NAND memory 20 according to the embodiment, with reference to FIG. 10A to FIG. 12C. FIG. 10A to FIG. 10C are diagrams illustrating exemplary timing charts of voltage application in the erase operation to the NAND memory 20 according to the embodiment. The timing charts in FIG. 10A to FIG. 10C depict an erase voltage Vera as an applied voltage to the substrate of the NAND memory 20. More specifically, during the erase operation, an erase voltage Vera is applied to the substrate and a verify voltage Vver is applied to the word line.

Figure 10B:
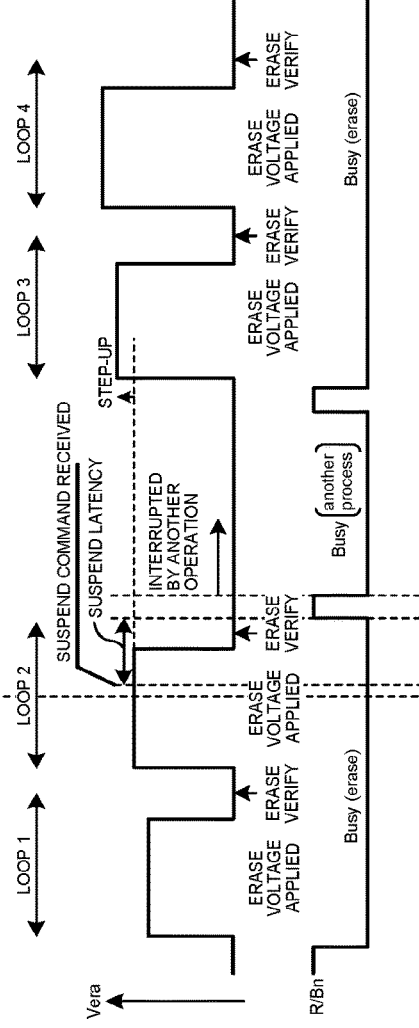
FIG. 10B is a diagram illustrating an exemplary timing chart of voltage-application during an erase operation of the NAND memory according to the embodiment.
Figure 10C:
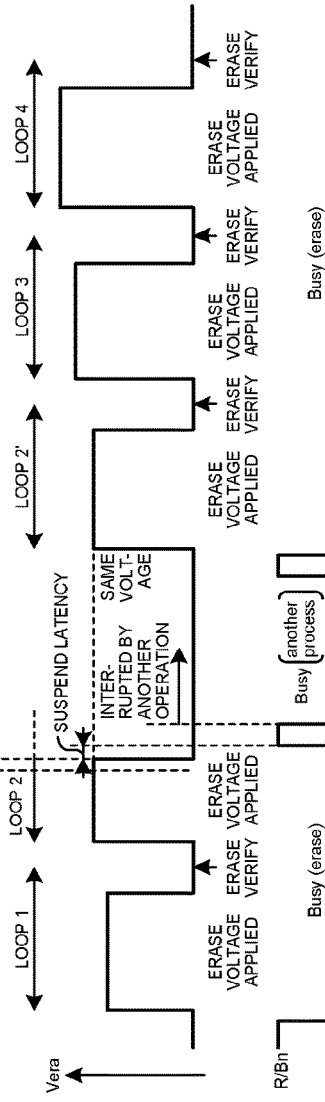
FIG. 10C is a diagram illustrating an exemplary timing chart of voltage-application during an erase operation of the NAND memory according to the embodiment.

As illustrated in FIG. 10A to FIG. 10C, a sequencer SEQ of the NAND memory 20 executes data erase operation to a given block BLK of the NAND memory 20 in accordance with a command from the memory controller 10. Specifically, the sequencer SEQ applies a power supply potential (VSS) to word lines connected to memory cells in an erase target block BLK, and applies the erase voltage Vera to the substrate of the NAND memory 20. Next, the sequencer SEQ stops application of the erase voltage Vera, and applies a verify voltage to the word lines connected to the memory cells in the given block BLK (the drawings illustrate timing alone and no applied voltage) to verify whether or not data has been erased from a given number or more of memory cells in the block BLK (erase verify). With a certain number or more of memory cells remaining unerased, the sequencer SEQ raises and applies the erase voltage Vera to the substrate again.

As described above, the sequencer SEQ alternately applies an erase voltage Vera and performs verification while stepping up the erase voltage Vera, until data is erased from a given number or more of memory cells in the erase target block BLK. A set of one application of the erase voltage Vera and one verify operation subsequent to the application is defined as one loop. Upon completion of one loop, the number of completed loops is registered in the register REG of the NAND memory 20. This allows the NAND memory 20 to store progress of the erase operation.

In other words, the NAND memory 20 of this embodiment does not store the progress in units smaller than the loop.

In a second loop (loop 2), the memory controller 10 receives a read request from the host 30 or acquires a command from a command queue, for example. The memory controller 10 determines the order of priority over a new request as another operation and the preceding erase operation to the NAND memory 20, referring to the currently available count of erase-suspend 14c.

In the example in FIG. 10A, the memory controller 10 issues no suspend commands, neither suspend with rollback commands nor suspend without rollback commands, and the NAND memory 20 does not suspend but continues the preceding erase operation. The NAND memory 20 continues the on-going loop 2 without suspension, and then executes, for example, a loop 3 and a loop 4. After completing the erase operation till the loop 4, for example, the NAND memory 20 executes another operation in accordance with a command from the memory controller 10.

The NAND memory 20 places an R/Bn signal in a busy state during execution of the preceding erase operation (Busy (erase) in FIG. 10A). After completion of the preceding erase operation, the NAND memory 20 places the R/Bn signal in a ready state, and receives a command for another operation from the memory controller 10. During execution of said another operation, the NAND memory 20 places the R/Bn signal in a busy state (Busy (another process) in FIG. 10A).

In the example in FIG. 10B, the memory controller 10 issues a suspend without rollback command, and the NAND memory 20 suspends the preceding erase operation and preferentially executes another operation. The NAND memory 20 completes the running loop 2 in accordance with the suspend without rollback command. Then, the NAND memory 20 does not proceed to the subsequent loop (loop 3) but suspends the erase operation, for example, and executes said another operation in accordance with a command from the memory controller 10.

After completion of said another operation, the NAND memory 20 resumes the suspended erase operation. Before the suspend, the erase operation is executed till a given section, that is, the end of the second loop. Thus, the NAND memory 20 resumes the erase operation from the start of the third loop without redundantly executing the second loop.

The NAND memory 20 places the R/Bn signal in a busy state during execution of the preceding erase operation (Busy (erase) in FIG. 10B). In response to issuance of the suspend without rollback command from the memory controller 10, the NAND memory 20 places the R/Bn signal in a ready state after completing a section of the loop 2, that is, the erase verify after the application of the erase voltage. The NAND memory 20 then receives a command for another operation from the memory controller 10. During execution of said another operation, the NAND memory 20 places the R/Bn signal in a busy state (Busy (another process) in FIG. 10B). Upon completion of said another operation, the NAND memory 20 places the R/Bn signal in a ready state and resumes the erase operation. During the erase operation, the NAND memory 20 places the R/Bn signal in a busy state (Busy (erase) in FIG. 10B).

In view of a variation in the erase voltage Vera in the suspend without rollback, one feature of the suspend without rollback is in that the erase operation is resumed at the erase voltage Vera stepped up from the erase voltage Vera immediately before the suspend.

In the example in FIG. 10C, the memory controller 10 issues a suspend with rollback command, and the NAND memory 20 suspends the preceding erase operation and preferentially executes another operation. The NAND memory 20 does not complete but suspends the running loop 2 in a relatively short time in accordance with the suspend with rollback command. Then, the NAND memory 20 executes said another operation in accordance with a command from the memory controller 10.

After completion of said another operation, the NAND memory 20 resumes the suspended erase operation. Before the suspend, the erase operation is suspended prior to a given section, that is, before completion of the second loop. Thus, the NAND memory 20 redundantly resumes the erase operation from the second loop (loop 2').

During execution of the preceding erase operation, the NAND memory 20 places the R/Bn signal in a busy state (Busy (erase) in FIG. 10C). In response to issuance of the suspend with rollback command from the memory controller 10, the NAND memory 20 does not continue the operation to the section of the loop 2 but suspends the erase operation, and places the R/Bn signal in a ready state. The NAND memory 20 receives a command for another operation from the memory controller 10. During execution of said another operation, the NAND memory 20 places the R/Bn signal in a busy state (Busy (another process) in FIG. 10C). After completion of said another operation, the NAND memory 20 places the R/Bn signal in a ready state, and resumes the erase operation. During the erase operation, the NAND memory 20 places the R/Bn signal in a busy state (Busy (erase) in FIG. 10C).

In view of a variation in the erase voltage Vera in the suspend with rollback, one feature of the suspend with rollback is in that the erase operation may be resumed at the same erase voltage Vera as the erase voltage immediately before the suspend.

Thus, in the memory system 1 selectively performing the suspend with rollback and the suspend without rollback, at the time of resuming the erase operation after the suspend, there are two kinds of voltage application, i.e., stepping up the erase voltage Vera and non-stepping up the erase voltage Vera from before the suspend. In the case of multiple issuances of the suspend with rollback command during a single erase operation, for example, the first loop (loop 1) alone may be repeated depending on the suspend timing, which will hinder progress of the erase operation.

Performing either of the suspend with rollback and the suspend without rollback enables earlier start of another operation during the preceding erase operation than performing no suspend. In comparing the suspend with rollback and the suspend without rollback, the suspend with rollback causes, for example, suspension of the erase operation without completing an on-going loop, which results in lower latency than the suspend without rollback.

Meanwhile, the suspend with rollback may cause redundancy in part of the erase operation after resuming, which is likely to elongate the execution time of the erase operation. In addition, the redundant erase operation may results in over-erase, which will deteriorate the reliability of the erase operation. The suspend without rollback causes no redundancy of the erase operation, so that the total time for the application of the erase voltage Vera in the erase operation does not differ much from that in the case of no suspend. Further, the suspend without rollback prevents deterioration in reliability of the erase operation unlike the suspend with rollback.

As described above, no execution of erase suspend and the execution of the suspend with rollback or the suspend without rollback both have advantages and disadvantages. In view of optimizing the memory system 1, combining these operations is preferable.

FIG. 11A to FIG. 11C are diagrams illustrating exemplary timing charts of voltage-application during program operation of the NAND memory 20 according to the embodiment. The timing charts illustrated in FIG. 11A to FIG. 11C depict an applied voltage Vcg to the word line connected to target memory cells. More specifically, the voltage applied to the word line during program operation includes a program voltage Vpgm and a verify voltage Vver.

As illustrated in FIG. 11A to FIG. 11C, the sequencer SEQ of the NAND memory 20 performs a program operation on data to given memory cells of the NAND memory 20 in accordance with a command from the memory controller 10. Specifically, the sequencer SEQ applies a program voltage Vcg (Vpgm) to a word line connected to the target memory cells. Next, the sequencer SEQ applies a verify voltage Vcg (Vver) to the word line connected to the target memory cells to verify whether intended data is programmed to a given number or more of memory cells among the target memory cells (program verify). If there remains a certain number or more of memory cells with a threshold voltage lower than a target value corresponding to data to be programmed, the sequencer SEQ steps up and applies the program voltage to the word line.

Thus, the sequencer SEQ alternately applies the program voltage and the verify voltage while stepping up the program voltage until intended data is programmed to a given number or more of memory cells among the target memory cells. A set of one application of a program voltage and one verify operation subsequent to the voltage application is defined as one loop. Upon every completion of one loop, the number of completed loops is registered in the register REG of the NAND memory 20. Thereby, the progress of the program operation is stored in the NAND memory 20. In other words, the NAND memory 20 of this embodiment does not store the progress in a unit smaller than the loop.

In a second loop (loop 2), for example, the memory controller 10 receives a read request from the host 30 or acquires a command from a command queue. The memory controller 10 sets the order of priority over a new operation and the preceding program operation, referring to the currently available count of program-suspend 14f.

In the example in FIG. 11A the memory controller 10 issues no suspend commands, neither the suspend with rollback commands nor the suspend without rollback commands, and the NAND memory 20 does not suspend but continues the preceding program operation. The NAND memory 20 does not suspend but continues the on-going loop 2, and then executes, for example, a loop 3 and a loop 4. Upon completion of the loop 4 being the end of the program operation, for example, the NAND memory 20 executes another operation in accordance with a command from the memory controller 10.

The NAND memory 20 places the R/Bn signal in a busy state during execution of the preceding program operation (Busy (program) in FIG. 11A). After completing the preceding program operation, the NAND memory 20 places the R/Bn signal in a ready state, and receives a command for another operation from the memory controller 10. During execution of said another operation, the NAND memory 20 places the R/Bn signal in a busy state (Busy (another process) in FIG. 11A).

In the example in FIG. 11B, the memory controller 10 issues the suspend without rollback command, and the NAND memory 20 suspends the preceding program operation and preferentially executes another operation. The NAND memory 20 completes the on-going loop 2 in accordance with the suspend without rollback command. The NAND memory 20 then suspends the program operation before proceeding to the subsequent loop (loop 3), for example, and executes another operation in accordance with a command from the memory controller 10.

After completion of said another operation, the NAND memory 20 resumes the suspended program operation. Before the suspend, the NAND memory 20 has executed the program operation until a given section, that is, the end of the second loop. Thus, the NAND memory 20 resumes the program operation from the start of the third loop without redundantly executing the second loop.

The NAND memory 20 places the R/Bn signal in a busy state during execution of the preceding program operation (Busy (program) in FIG. 11B). In response to issuance of the suspend without rollback command from the memory controller 10, the R/Bn signal is placed in a ready state after completing the end of the loop 2, that is, the end of the program verify operation after application of the program voltage. The NAND memory 20 then receives a command for another operation from the memory controller 10. During execution of said another operation, the NAND memory 20 places the R/Bn signal in a busy state (Busy (another process) in FIG. 11B). After completing said another operation, the NAND memory 20 places the R/Bn signal in a ready state, and resumes the program operation. During the program operation, the NAND memory 20 places the R/Bn signal in a busy state (Busy (program) in FIG. 11B).

In view of a variation in the program voltage Vcg in the suspend without rollback, one feature of the suspend without rollback is in that the program operation is resumed at a program voltage Vcg stepped up from the program voltage Vcg immediately before the suspend.

In the example in FIG. 11C the memory controller 10 issues the suspend with rollback command, and the NAND memory 20 suspends the preceding program operation and preferentially executes another operation. The NAND memory 20 suspends the on-going loop 2 before completing the operation of the loop 2, in accordance with the suspend with rollback command. Then, the NAND memory 20 executes another operation in accordance with a command from the memory controller 10.

After completion of said another operation, the NAND memory 20 resumes the suspended program operation. Before suspend, the program operation is suspended before a given section, that is, the end of the second loop. Thus, the NAND memory 20 redundantly resumes the program operation from the second loop (loop 2').

During execution of the preceding program operation, the NAND memory 20 places the R/Bn signal in a busy state (Busy (program) in FIG. 11C). In response to issuance of the suspend with rollback command from the memory controller 10, the NAND memory 20 does not continue the loop 2 until the given section but suspends the operation, and places the R/Bn signal in a ready state. The NAND memory 20 then receives a command for another operation from the memory controller 10. During execution of said another operation, the NAND memory 20 places the R/Bn signal in a busy state (Busy (another process) in FIG. 11C). After completing said another operation, the NAND memory 20 places the R/Bn signal in a ready state, and resumes the program operation. During the program operation, the NAND memory 20 places the R/Bn signal in a busy state (Busy (program) in FIG. 11C).

In view of a variation in the program voltage Vcg in the suspend with rollback, one feature of the suspend with rollback is in that the program operation may be resumed at the same program voltage Vcg as the program voltage Vcg immediately before the suspend.

Thus, in the memory system 1 selectively performing the suspend with rollback and the suspend without rollback, for resuming the program operation after the suspend, there are two kinds of voltage application, i.e., stepping up and non-stepping of the program voltage Vcg from before the suspend.

Performing either the suspend with rollback or the suspend without rollback enables earlier start of another operation during the preceding program operation than performing no suspend. In comparing the suspend with rollback and the suspend without rollback, the suspend with rollback causes, for example, suspension of the program operation before completing an on-going loop, which results in lower latency than the suspend without rollback.

Meanwhile, the suspend with rollback may cause redundancy in the program operation after resuming, which is likely to elongate the execution time of the program operation. In addition, the redundancy in the program operation may result in over-program in which a threshold voltage rises above a target value, or a program disturbance to non-target memory cells, which will deteriorate the reliability of the program operation. The suspend without rollback causes no redundancy in the program operation, so that the total time for applying the program voltage in the program operation does not differ much from that in the case of no suspend. Further, the suspend without rollback can avoid deterioration in the reliability of the program operation in comparison with the suspend with rollback.

As described above, no execution of program suspend and the execution of the suspend with rollback or the suspend without rollback both have advantages and disadvantages. In view of optimizing the memory system 1, combining these operations is preferable.

At the time of resuming the program operation after the suspend with rollback and the suspend without rollback, the NAND memory may perform a pre-verify operation before application of the program voltage, which is illustrated in FIG. 12A to FIG. 12C. FIG. 12A to FIG. 12C are diagrams illustrating another exemplary timing chart of the voltage application during the program operation to the NAND memory according to the embodiment.

As illustrated in FIG. 12A, with no suspension of the program operation, the operation in the example of FIG. 12A is similar to that in the example of FIG. 11A.

As illustrated in FIG. 12B and FIG. 12C, the program operation is suspended by either of the suspend with rollback and the suspend without rollback. In the examples of FIG. 12B and FIG. 12C, at the time of resuming the program operation, a verify voltage is applied to the word line as in a verify operation after application of a given program voltage. Through the pre-verify operation, a present threshold-voltage distribution of target memory cells is checked, and thereafter the application of the program voltage is resumed.

As described above, in the pre-verify operation, the same voltage as that in typical verify operation is applied to the word line regardless of the suspend with rollback and the suspend without rollback, therefore, a pre-verify operation is not regarded as a rollback operation. In the case where the pre-verify operation is performed after resume, the suspend with rollback and the suspend without rollback are discriminated according to a program voltage value applied after the pre-verify operation. In the erase operation, the pre-verify operation may also be performed after resume.

Erase-Suspend Command Sequence

Next, a description will be given of an erase-suspend command sequence of the NAND memory 20 as a preceding operation, with reference to FIG. 13A and FIG. 13B. FIG. 13A and FIG. 13B are diagrams illustrating exemplary erase-suspend command sequences in the memory system 1 according to the embodiment. FIG. 13A illustrates an exemplary command sequence of the suspend with rollback, and FIG. 13B illustrates an exemplary command sequence of the suspend without rollback.

As illustrated in FIG. 13A, for example, the memory controller 10 gives an erase instruction to the NAND memory 20. Specifically, the memory controller 10 transmits "60h" command indicating transmission of an address of an erase target block BLK, and the address (Addr) to the NAND memory 20. The memory controller 10 transmits an erase command "D0h" to the NAND memory 20 to erase data from a block BLK designated by the address. The erase operation is performed to all the memory cells of the block BLK.

The NAND memory 20 places the R/Bn signal in a busy state and starts the erase operation (Busy (erase) in FIG. 13A). The NAND memory 20 sets all the word lines connected to the memory cells in the target block BLK to power supply potential (VSS), and applies an erase voltage Vera to the substrate of the NAND memory 20. The erase voltage Vera is applied while being stepped up in stepwise manner. Upon each step-up, the NAND memory 20 verifies whether the target memory cells enter an erase state. With a certain number or more of memory cells not entering the erase state, the NAND memory 20 further steps up the erase voltage Vera, and repeats the step-up until the certain number or more of target memory cells enter the erase state. As described above, a set of the application of the erase voltage Vera and the verify operation corresponds to one loop of the erase operation, for example. The loop is repeated once or more in the erase operation until all of the target memory cells enter the erase state.

In a "Busy (erase)" (FIG. 13A) state indicating that the erase operation is being executed, for example, in response to a read request from the host 30, the memory controller 10 transmits, for example, a suspend with rollback command "Exh" to the NAND memory 20. When receiving the suspend with rollback command, the NAND memory 20 does not continue the erase operation to the end of a loop but suspends the erase operation in a relatively short time, and places the R/Bn signal in a ready state. The memory controller 10 recognizes a ready or busy state of the NAND memory 20 with the R/Bn signal or issuance of a status read command.

After the NAND memory 20 enters a ready state, the memory controller 10 instructs the NAND memory 20 to perform a read operation, in accordance with the read request from the host 30. Specifically, the memory controller 10 transmits a "00h" command indicating transmission of the address of a read target memory cell, and the address (Addr) to the NAND memory 20. In addition, the memory controller 10 transmits a read command "D0h" to the NAND memory 20 to cause the NAND memory 20 to read data from the memory cell designated by the address. The NAND memory 20 places the R/Bn signal in a busy state and initiates the read operation (Busy (read) in FIG. 13A).

After the read operation to the memory cell is completed and the R/Bn signal enters a ready state, the memory controller 10 transmits a column address of the read target memory cells (transmission of "05h" command and address (Addr)) and instructs the NAND memory 20 to output data ("e0h" command and read data (R-data)). This completes the read operation in response to the read request from the host 30.

The memory controller 10 transmits, to the NAND memory 20, a "27h" command for recovering the internal state of the NAND memory 20 to a state at the time of erase suspend. More specifically, the "27h" command is a command that causes the sequencer SEQ of the NAND memory 20 to acquire necessary information for resuming a suspended erase operation, such as the number of completed loops before suspending the erase operation. The sequencer SEQ recovers the internal state of the NAND memory 20 on the basis of the acquired information. In addition, the memory controller 10 transmits a "60h" command, an erase target address (Addr), and an erase command D0h to the NAND memory 20 to resume the suspended erase operation.

The NAND memory 20 places the R/Bn signal in a busy state and resumes the erase operation (Busy (erase) in FIG. 13A). The erase operation is suspended by the suspend with rollback, therefore, the erase operation may be suspended in the middle of any of the loops. In this case, the suspended loop is not counted as a completed loop at the time of suspend. That is, the suspended loop is not included in the number of completed loops registered in the register REG of the NAND memory 20. Thus, the NAND memory 20 determines the erase voltage Vera to be a voltage value of the suspended loop, and executes the erase operation from the start of the suspended loop.

As described above, in the suspend with rollback, a part of the erase operation completed before the suspend may be repeated. This may elongate the total time of the erase operation in comparison with that in the case of no suspend.

Next, a suspend without rollback command sequence will be described.

As illustrated in FIG. 13B, the memory controller 10 transmits the "60h" command, the erase target address (Addr), and the erase command "D0h" to the NAND memory 20 to cause the NAND memory 20 to execute an erase operation.

The NAND memory 20 sets, to a power supply potential, the word lines connected to the memory cells in a target block BLK, and applies the erase voltage Vera to the substrate of the NAND memory 20 while stepping up the erase voltage Vera in a stepwise manner.

After receiving a read request from the host 30 during execution of the erase operation, the memory controller 10 transmits, for example, a suspend without rollback command Eyh to the NAND memory 20. If the erase operation is in the middle of a loop of application of the erase voltage Vera or a verify operation, the NAND memory 20 continues the erase operation to the end of the loop, and then suspends the erase operation. The end point of the loop corresponds to the above-described given section, and this loop is registered in the register REG of the NAND memory 20 as the number of completed loops before the suspend.

After the erase operation is suspended and the R/Bn signal is placed in a ready state, the memory controller 10 transmits the "00h" command, the read target address (Addr), and the read command D0h to the NAND memory 20 to cause the NAND memory 20 to execute a read operation, in accordance with a read request from the host 30. In addition, the memory controller 10 transmits the "05h" command, the read target address (Addr), and the "e0h" command to cause the NAND memory 20 to output read data (R-data).

The memory controller 10 transmits the "27h" command to the NAND memory 20 to cause the NAND memory 20 to recover the internal state to a state at the time of the erase suspend. Then, the memory controller 10 transmits the "60h" command, the erase target address (Addr), and the erase command D0h. The NAND memory 20 has advanced the erase operation up to a given section, that is, the end of an on-going loop at the time of the suspend. Because of this, the NAND memory 20 steps up the erase voltage Vera to a voltage subsequent to the voltage at the time of the suspend, and resumes the erase operation (Busy (erase) in FIG. 13B).

Thus, in the suspend without rollback, the erase operation is resumed without redundancy. Hence, the suspend causes substantially no change in the total time for applying the erase voltage Vera in the erase operation from that by the non-execution of the suspend.

In-between the suspend with rollback and the suspend without rollback, as described above, a time from the issuance of the suspend command to the ready state of the NAND memory 20 may be differ. That is, the maximum length of time from the issuance of the suspend command to the ready state of the NAND memory 20 may be longer in the suspend without rollback than in the suspend with rollback. However, a time taken for the NAND memory 20 to enter a ready state in the suspend without rollback may not substantially differ if the suspend command is issued coincidentally at the timing matching the given section.

Program-Suspend Command Sequence

Next, a description will be given of a command sequence when the NAND memory 20 suspends an on-going program operation as a preceding operation, with reference to FIG. 14A and FIG. 14B. FIG. 14A and FIG. 14B are diagrams illustrating exemplary program-suspend command sequences in the memory system 1 according to the embodiment. FIG. 14A illustrates an exemplary suspend with rollback command sequence, and FIG. 14B illustrates an exemplary suspend without rollback command sequence.

As illustrated in FIG. 14A, the memory controller 10 gives a program instruction to the NAND memory 20, for example. Specifically, the memory controller 10 transmits an "8xh" command indicating transmission of an address of a target memory cell and the address (Addr1) to the NAND memory 20. In addition, the memory controller 10 transmits a program command 1xh and write data DIN to the NAND memory 20 to cause the NAND memory 20 to execute a program operation to the memory cell corresponding to the address.

The NAND memory 20 places the R/Bn signal in a busy state to initiate the program operation. The NAND memory 20 applies a program voltage Vcg to the gate of each target memory cell. The program voltage Vcg is applied while being stepped up in a stepwise manner. Upon each step-up, the NAND memory 20 verifies whether target data is programmed to the target memory cell. If there are a certain number or more of memory cells with a threshold voltage lower than a given voltage value corresponding to data to be programmed, the NAND memory 20 further steps up the program voltage Vcg, and repeats the stepping-up until intended data is programmed to a given number or more of target memory cells. As described above, for example, a set of the program voltage Vcg and the verify operation corresponds to one loop of the program operation. The loop is repeated once or more in the program operation until intended data is programmed to the given number or more of target memory cells.

After receiving a read request from the host 30 during the execution of the program operation, the memory controller 10 transmits a suspend with rollback command Pxh to the NAND memory 20, for example. Upon receipt of the suspend with rollback command, the NAND memory 20 suspends the program operation in a shorter time than the suspend without rollback, and places the R/Bn signal in a ready state.

After suspending the program operation, the memory controller 10 transmits the "00h" command, a read target address (Addr2), and a read command 30h to the NAND memory 20 to cause the NAND memory 20 to execute a read operation, in accordance with the read request from the host 30. In addition, the memory controller 10 causes the NAND memory 20 to output read data (transmission of a "05h" command and an address (Addr), transmission of an "e0h" command, and output of the read data (R-data in FIG. 14A)).

The memory controller 10 transmits a "48h" command to cause the NAND memory 20 to resume the program operation. The program operation is suspended by the suspend with rollback, therefore, it may be suspended in the middle of any of the loops. Thus, depending on the timing of the suspend, the suspended loop is not counted as a completed loop at the time of the suspend, and is not included in the number of completed loops registered in the register REG of the NAND memory 20. That is, the NAND memory 20 does not store progress in a unit smaller than the loop, as described above, and thus the NAND memory 20 does not accurately store an operation performed immediately before the suspend, and redundantly executes part of the operation. More specifically, the NAND memory 20 returns the program voltage Vcg to a program voltage value corresponding to the suspended loop, and executes the program operation from the beginning of the suspended loop.

As described above, in the suspend with rollback, the program operation performed before the suspend may be repeated. This may elongate the total time of the program operation than that in the case of no suspend.

Next, a suspend without rollback command sequence will be described.

As illustrated in FIG. 14B, the memory controller 10 transmits the "8xh" command, the program target address (Addr1), and the program command 1xh to cause the NAND memory 20 to execute a program operation.

The NAND memory 20 applies the program voltage Vcg to the gate of each target memory cell while stepping up the program voltage Vcg in a stepwise manner.

After receiving a read request from the host 30 during the execution of the program operation, the memory controller 10 transmits, for example, a suspend without rollback command Pyh to the NAND memory 20. If the program operation is in the middle of a loop of application of a program voltage Vcg and verify operation, the NAND memory 20 continues the program operation to the end of the loop and suspends the program operation. The end of the loop corresponds to the given section, and this loop is registered in the register REG of the NAND memory 20 as the number of completed loops before the suspend.

After the program is suspended and the R/Bn signal is set in a ready state, the memory controller 10 transmits the "00h" command, the read target address (Addr2), and the read command 30h to cause the NAND memory 20 to execute a read operation, in accordance with the read request from the host 30. In addition, the memory controller 10 causes the NAND memory 20 to output read data (transmission of the "05h" command and the address (Addr), transmission of the "e0h" command, and output of the read data (R-data in FIG. 14B)).

The memory controller 10 transmits the "48h" command to cause the NAND memory 20 to resume the program operation. The NAND memory 20 has advanced the program operation up to a given section, that is, the end of an on-going loop at the time of the suspend. Thus, the NAND memory 20 steps up the program voltage Vcg to a voltage value subsequent to the voltage at the time of the suspend, and resumes the program operation.

As described above, in the suspend without rollback, the program is resumed without redundancy. Because of this, the suspend causes substantially no change in the total time for applying the program voltage Vcg in the program operation from that in the case of no execution of the suspend.

Exemplary Erase Suspend Process

Figure 15:
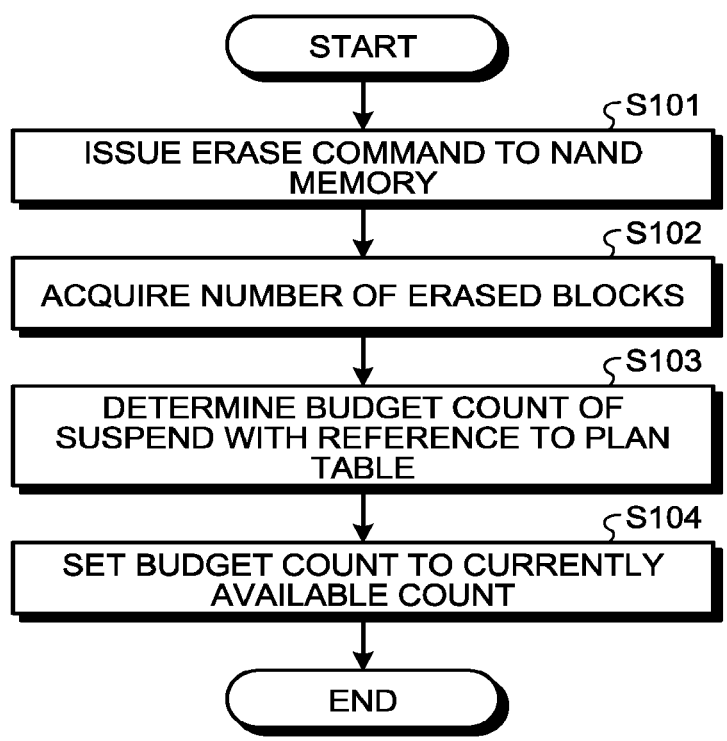
FIG. 15 is a flowchart illustrating an exemplary procedure of determining the budget count of suspends with rollback and suspends without rollback in the erase operation by the memory controller according to the embodiment.

Next, a description will be given of an exemplary procedure of the NAND memory 20 when suspending the preceding erase operation in accordance with the budget count of suspends, with reference to FIG. 15 and FIG. 16. FIG. 15 is a flowchart illustrating an exemplary procedure of the memory controller 10 according to the embodiment to determine the budget count of suspends with rollback and suspends without rollback in the erase operation.

In this example, the data acquirer 11a of the control unit 11 of the memory controller 10 acquires the number of erased blocks after the compaction and other operations, and stores the number of blocks in the number of erased blocks 14a. The data acquirer 11a may acquire the number of erased blocks and store the number of erased blocks in the number of erased blocks 14a at any timing.

As illustrated in FIG. 15, the command issuer 11c of the memory controller 10 issues an erase command to the NAND memory 20 at a given timing (Step S101). The calculator 11b acquires the number of erased blocks from the number of erased blocks 14a (Step S102). The calculator 11b determines the numbers of suspends with rollback and suspends without rollback in accordance with the reference to the erase-suspend plan table 14b (Step S103). The calculator 11b sets the determined budget counts of suspends to the currently available count of erase-suspend 14c as the currently available counts of suspend with rollback and currently available counts of suspend without rollback (Step S104).

Figure 16:
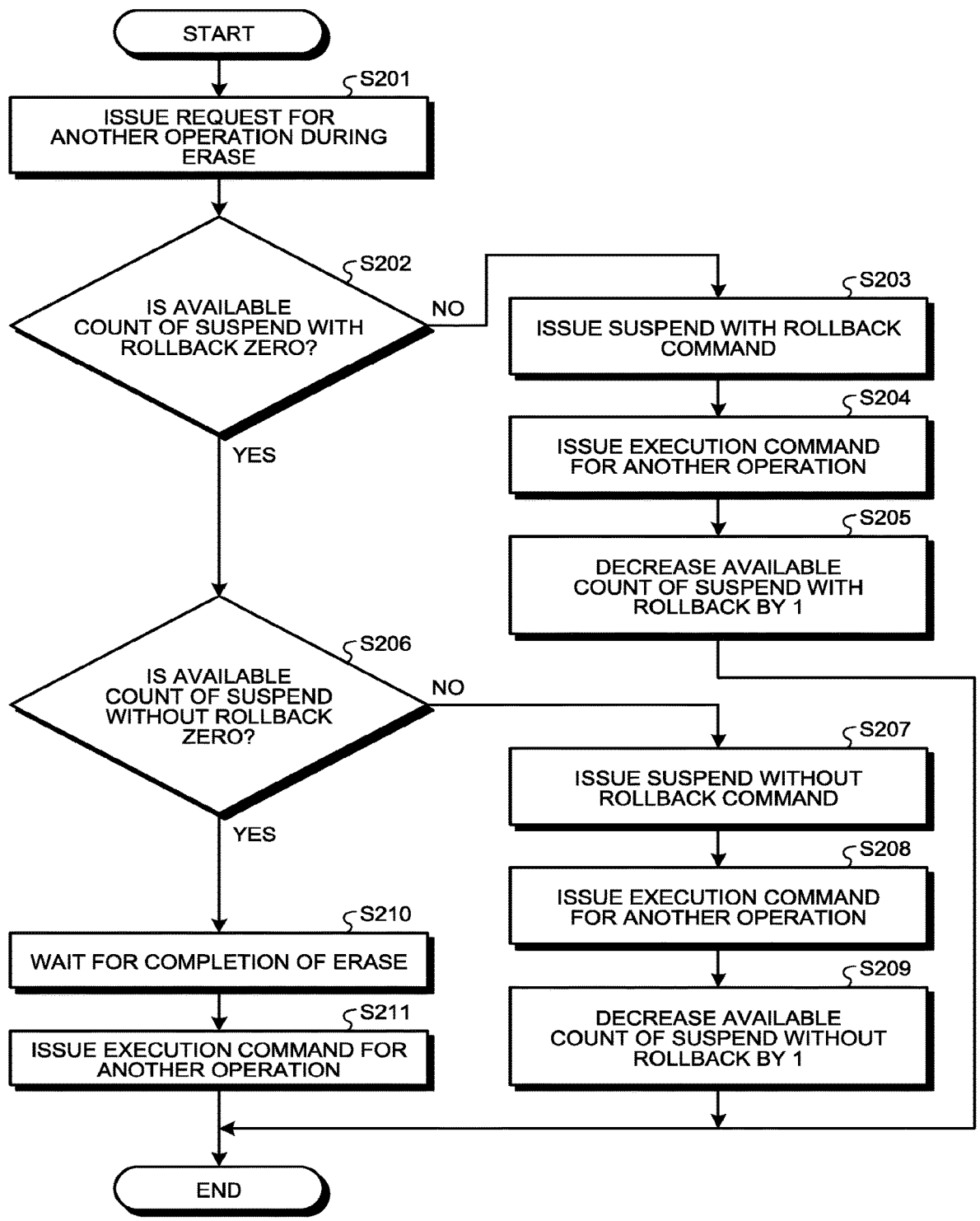
FIG. 16 is a flowchart illustrating an exemplary erase-suspend procedure in the memory system according to the embodiment.

FIG. 16 is a flowchart illustrating an exemplary erase-suspend procedure in the memory system 1 according to the embodiment.

As illustrated in FIG. 16, a request for another operation, e.g., a new request from the host 30, is issued during a preceding erase operation of the NAND memory 20, for example, (Step S201). The calculator 11b checks whether the currently available count of suspend with rollback in the currently available count of erase-suspend 14c is zero (Step S202).

With the currently available count of suspend with rollback in the currently available count of erase-suspend 14c being other than zero (No in Step S202), the command issuer 11c issues a suspend with rollback command (Step S203). The command issuer 11c issues an execution command for said another operation to the NAND memory 20 (Step S204). After the NAND memory 20 completes said another operation, the command issuer 11c issues a resume command to the NAND memory 20. The NAND memory 20 resumes the erase operation in accordance with the resume command received from the command issuer 11c. The calculator 11b decreases the currently available count of suspend with rollback in the currently available count of erase-suspend 14c by one (Step S205). This completes the erase suspend process.

With the currently available count of suspend with rollback in the currently available count of erase-suspend 14c being zero (Yes in Step S202), the calculator 11b checks whether the currently available count of suspend without rollback in the currently available count of erase-suspend 14c is zero (Step S206).

With the currently available count of suspend without rollback in the currently available count of erase-suspend 14c being other than zero (No in Step S206), the command issuer 11c issues a suspend without rollback command (Step S207). The command issuer 11c issues an execution command for said another operation to the NAND memory 20 (Step S208). After the NAND memory 20 completes said another operation, the command issuer 11c issues a resume command to the NAND memory 20. The NAND memory 20 resumes the erase operation in accordance with the resume command received from the command issuer 11c. The calculator 11b decreases the currently available count of suspend without rollback in the currently available count of erase-suspend 14c by one (Step S209). This completes the erase suspend process.

With the currently available count of suspend without rollback in the currently available count of erase-suspend 14c being zero (Yes in Step S206), the command issuer 11c waits for completion of the erase operation by the NAND memory 20 (Step S210) and issues an execution command for said another operation to the NAND memory 20 (Step S211).

As described above, the process of suspending the preceding erase operation of the NAND memory 20 in accordance with the budget count of suspends is completed.

Figure 17:
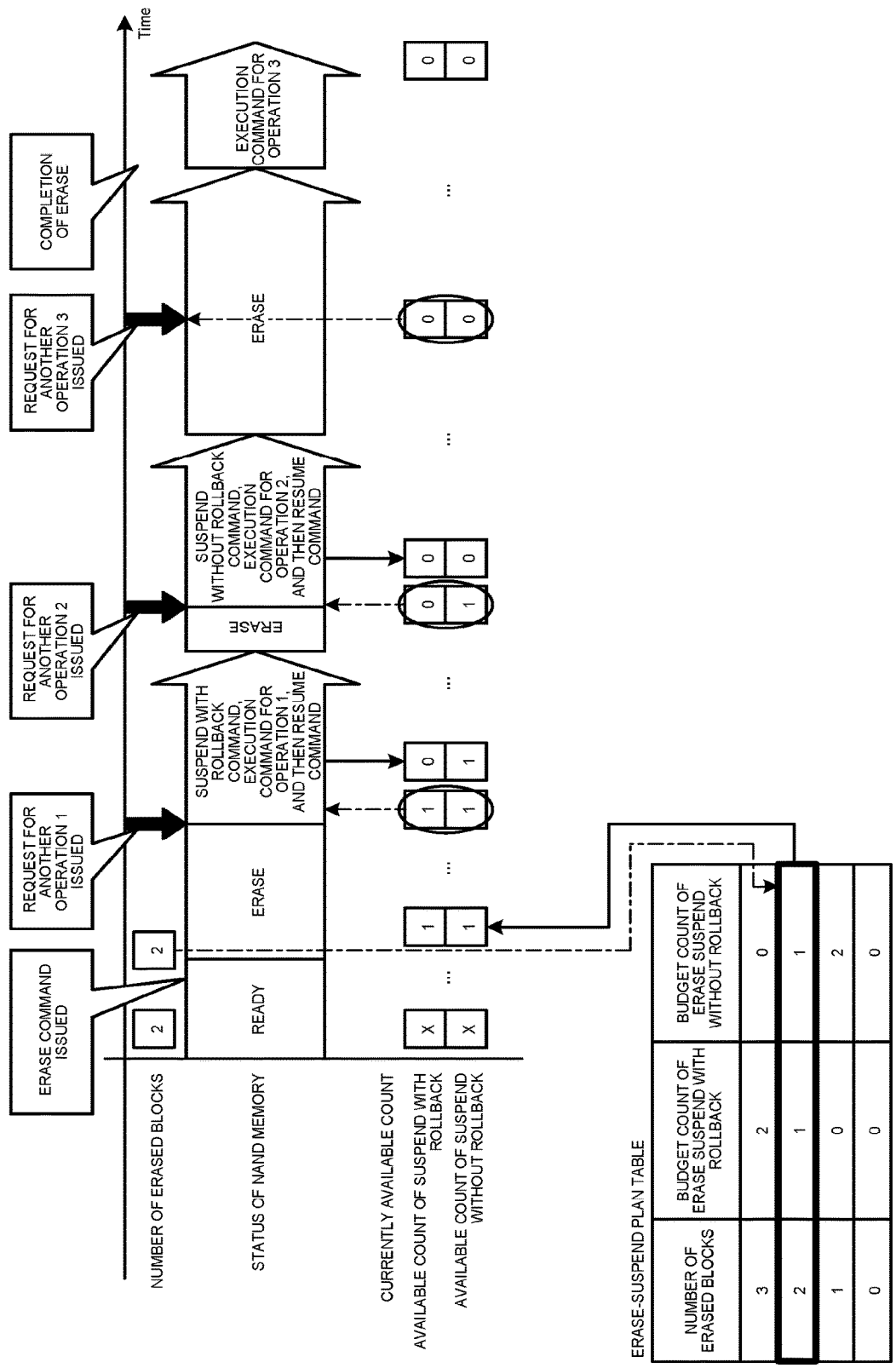
FIG. 17 is a diagram illustrating a variation in time in the currently available count of suspend with rollback and the currently available suspend count of suspend without rollback which are managed in the memory system according to the embodiment.

A description will now be given of a variation in time in the currently available counts of suspend with rollback and suspend without rollback in the erase suspend process, with reference to FIG. 17. FIG. 17 is a diagram illustrating a variation in time in the currently available counts of suspend with rollback and suspend without rollback managed in the memory system according to the embodiment.

As illustrated in FIG. 17, the NAND memory 20 is in a ready state, and the number of erased blocks is two, by way of example. That is, the number of erased blocks 14a contains the number "2". Since no erase command is issued at this point, the currently available counts of suspend with rollback and suspend without rollback are not set in the currently available count of erase-suspend 14c.

In response to issuance of the erase command from the command issuer 11c, the calculator 11b acquires the number of erased blocks from the number of erased blocks 14a, and sets both the budget count of suspends with rollback and the budget count of suspends without rollback to "1", with reference to the erase-suspend plan table 14b. The calculator 11b registers "1" in the currently available count of suspend with rollback and the currently available count of suspend without rollback of the currently available count of erase-suspend 14c.

A request for first another operation (in the drawing, another operation 1) is issued to the NAND memory 20 while executing the erase operation. The calculator 11b selects a suspend with rollback to be executed in accordance with the value in the currently available count of erase-suspend 14c. The command issuer 11c issues a suspend with rollback command to the NAND memory 20, and issues an execution command for the first another operation. After executing the first another operation, the command issuer 11c issues a resume command for the erase operation to the NAND memory 20. The calculator 11b decreases the currently available count of suspend with rollback in the currently available count of erase-suspend 14c to zero.

The NAND memory 20 suspends the erase operation before proceeding to a given section, and performs the first another operation and resumes the erase operation by repeating part of the operation performed before the suspend as necessary, in accordance with the resume command from the memory controller 10. In the case of issuance of a request for second another operation (in the drawing, another operation 2) after resuming the erase operation, the calculator 11b selects the suspend without rollback to be executed according to the value in the currently available count of erase-suspend 14c. The command issuer 11c issues a suspend without rollback command to the NAND memory 20, and issues an execution command for the second another operation. After executing the second another operation, the command issuer 11c issues a resume command for the erase operation to the NAND memory 20. The calculator 11b decreases the currently available count of suspend without rollback in the currently available count of erase-suspend 14c to "0".

The NAND memory 20 suspends the erase operation at a given section, performs the second another operation, and resumes the erase operation without repeating part of the operation performed before the suspend, in accordance with the resume command from the memory controller 10. In the case of issuance of a request for third another operation (in the drawing, another operation 3) after resuming the erase operation, the NAND memory 20 selects neither the suspend with rollback nor the suspend without rollback and the command issuer 11c issues no suspend command since the values in the currently available count of erase-suspend 14c are both zero. The NAND memory 20 completes the erase operation without suspension. Then, the command issuer 11c issues an execution command for third another operation to the NAND memory 20.

Exemplary Program Suspend Process

Figure 18:
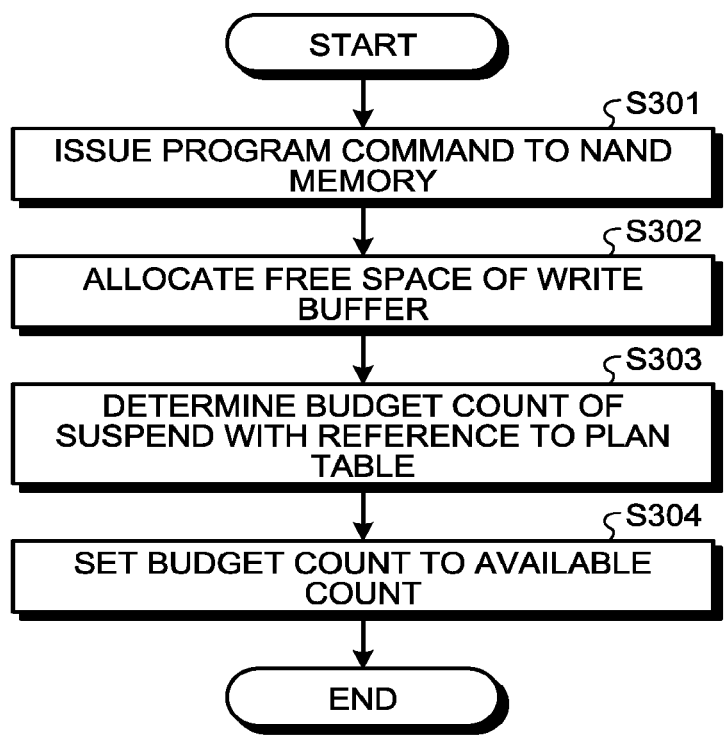
FIG. 18 is a flowchart illustrating an exemplary procedure of determining the budget count of suspends with rollback and suspends without rollback in the program operation by the memory controller according to the embodiment.

Next, a description will be given of an exemplary procedure of suspending a preceding program operation executed by the NAND memory 20, with reference to FIG. 18. FIG. 18 is a flowchart illustrating an exemplary procedure of determining the budget counts of suspends with rollback and suspends without rollback during program operation in the memory system 1 according to the embodiment.

In this example, the data acquirer 11a of the memory controller 10 acquires the free space of the write buffer 14g which varies in accordance with amount of data to be written, and stores the free space in the free space size in write buffer 14d. The data acquirer 11a can acquire and store the free space of the write buffer 14g in the free space size in write buffer 14d at any timing.

As illustrated in FIG. 18, the command issuer 11c of the memory controller 10 issues a program command to the NAND memory 20 at any timing (Step S301). The calculator 11h allocates the free space of the write buffer 14g from the free space size in write buffer 14d (Step S302). The calculator 11b determines the numbers of suspends with rollback and suspends without rollback to be executed according to the acquired free space of the write buffer 14g, with reference to the program-suspend plan table 14e (Step S303). The calculator lib sets the determined budget count of suspends to the currently available count of program-suspend 14f as the currently available counts of suspend with rollback and suspend without rollback (Step S304).

Figure 19:
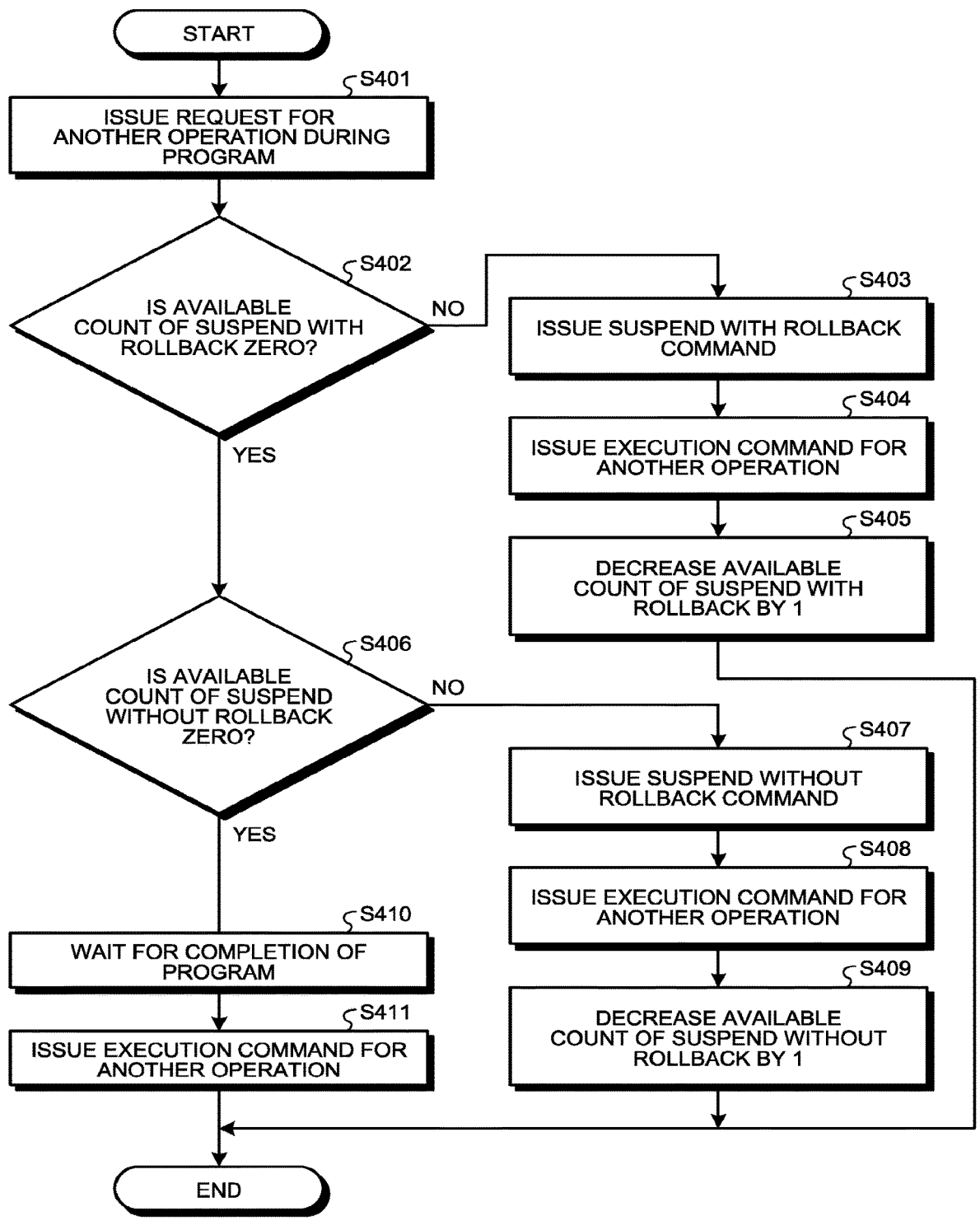
FIG. 19 is a flowchart illustrating an exemplary program-suspend procedure in the memory system according to the embodiment.

FIG. 19 is a flowchart illustrating an exemplary program-suspend process of the memory system 1 according to the embodiment.

As illustrated in FIG. 19, in response to issuance of a request for another operation such as a new request from the host 30 during execution of a preceding program operation (Step S401) of the NAND memory 20, the calculator 11b checks whether the currently available count of suspend with rollback in the currently available count of program-suspend 14f is zero (Step S402).

With the currently available count of suspend with rollback being other than zero in the currently available count of program-suspend 14f (No in Step S402), the command issuer 11c issues a suspend with rollback command (Step S403). The command issuer 11c issues an execution command for said another operation to the NAND memory 20 (Step S404). After completion of said another operation of the NAND memory 20, the command issuer 11c issues a resume command to the NAND memory 20. The NAND memory 20 resumes the program operation in accordance with the resume command received from the command issuer 11c. The calculator 11b decreases the currently available count of suspend with rollback in the currently available count of program-suspend 14f by "1" (Step S405). This completes the program suspend process.

With the currently available count of suspend with rollback being zero in the currently available count of program-suspend 14f (Yes in Step S402), the calculator 11b checks whether the currently available count of suspend without rollback in the currently available count of program-suspend 14f is zero (Step S406).

With the currently available count of suspend without rollback being other than zero in the currently available count of program-suspend 14f (No in Step S406), the command issuer 11c issues a suspend without rollback command (Step S407). The command issuer 11c issues an execution command for said another operation to the NAND memory 20 (Step S408). After completion of said another operation in the NAND memory 20, the command issuer 11c issues a resume command to the NAND memory 20. The NAND memory 20 resumes the program operation in accordance with the resume command received from the command issuer 11c. The calculator 11b decreases the currently available count of suspend without rollback in the currently available count of program-suspend 14f by "1" (Step S409). As described above, the program suspend process is completed.

With the currently available count of suspend without rollback being zero in the currently available count of program-suspend 14f (Yes in Step S406), the command issuer 11c waits for completion of the program operation in the NAND memory 20 (Step S410), and issues an execution command for said another operation to the NAND memory 20 (Step S411).

This ends the process of suspending the preceding program operation executed by the NAND memory 20 in accordance with the budget count of suspends.

Comparative Examples

The following will describe memory systems for comparison which do not selectively perform the suspend with rollback operation, the suspend without rollback operation, and no suspend operation, by way of example.

A memory system of a first comparison performs no suspend operation. Thus, no delay occurs in a preceding operation such as a flush operation and a compaction. However, this memory system cannot respond to a request from the host until the completion of the preceding operation, irrespective of a sufficient free space of the erased blocks, for example. This is likely to increase latency for a read request and a write request. Further, this memory system cannot respond to a request from the host until the completion of the preceding operation, irrespective of a sufficient free space of the write buffer, for example. This is likely to increase latency for a read request.

A memory system of a second comparison always performs the suspend with rollback operation. Thus, this memory system can avoid increase in latency, which would otherwise occur from the situation that the memory system cannot immediately respond to a request from the host due to a preceding operation. However, delay in the flush operation, the compaction, or the erase operation may cause deficiency in the number of erased blocks or the free space of the write buffer. In such a case, the memory system cannot respond to a request from the host until the deficiency is resolved. This is likely to increase latency for a write request. In addition, the operation performed before the suspend may be repeated, which will elongate the total time of the preceding operation and wear out the memory cells. Further, a certain block may remain in an erase state for a long time, causing data retention issues. This is likely to result in lowering reliability since the memory system cannot subsequently perform an intended program operation.

A memory system of a third comparison always performs the suspend without rollback operation. Thus, delay in a preceding operation such as the flush operation and the compaction is unlikely to occur unlike the suspend with rollback. This memory system can also quickly respond to a request from the host to some extent. However, the memory system cannot deal with significant delay in the flush operation or the compaction or may not be able to sufficiently promptly respond to an urgent read request from the host. The memory system resumes the preceding operation from a point subsequent to the suspended one, but the preceding operation is somewhat affected by the suspend. Thus, a certain block may remain in an erase state or in a program operation for a long time, which will lower reliability, as the suspend with rollback.

As described above, a fixed suspend control may not be able to follow an ever-changing state of a memory system and optimally deal with the state of a moment.

To the contrary, the memory system 1 of the embodiment selectively performs the suspend with rollback operation, the suspend without rollback operation, and no suspend operation dynamically. This makes it possible to appropriately change the order of priority between a preceding operation and another operation such as an operation in response to a request from the host 30. As a result, it is possible to shorten a response time with respect to the request from the host 30 on the whole.

The memory system 1 according to the embodiment selectively performs the suspend with rollback operation, the suspend without rollback operation, and no suspend operation dynamically by setting the budget count of suspends with rollback and the budget count of suspends without rollback in accordance with the number of erased blocks and the free space of the write buffer 14g. Thereby, the memory system 1 can properly deal with the operation depending on the state of the memory system 1, which makes it possible to shorten a response time with respect to the request from the host 30.

In the memory system 1 of the embodiment, the memory controller 10 selectively performs the suspend with rollback operation, the suspend without rollback operation, and no suspend operation, by way of example, but is not limited to such an example. The memory controller may be configured to selectively perform at least two of the suspend with rollback operation, the suspend without rollback operation, and no suspend operation. That is, the memory controller may selectively perform the suspend with rollback operation and no suspend operation. The memory controller may selectively perform the suspend without rollback operation and no suspend operation. The memory controller may selectively perform the suspend with rollback operation and the suspend without rollback operation. That is, the memory controller selectively performs two of the suspend with rollback operation, the suspend without rollback operation, and no suspend operation dynamically, thereby enabling further reduction of a response time to the host than the first to third comparisons which fixedly perform only one of them.

In the memory system 1 of the embodiment, during an erase operation of the NAND memory 20, the memory controller 10 properly determines the numbers of suspends with rollback, suspends without rollback, and no suspends on the basis of the number of erased blocks by way of example, but is not limited to such an example. The memory controller may properly determine the numbers of suspends with rollback, suspends without rollback, and no suspends on the basis of the number of programmable clusters or pages or word lines without an additional erase operation. The memory system 1 can more accurately determine the numbers of suspends with rollback, suspends without rollback, and no suspends by determining the budget count of suspends on the basis of a criterion such as the number of clusters or pages or word lines, which have higher resolution than the number of blocks.

The memory system 1 of the embodiment controls the numbers of suspends with rollback, suspends without rollback, and no suspends by managing the currently available count of suspend with rollback and the currently available count of suspend without rollback in the currently available count of erase-suspend 14c and the currently available count of program-suspend 14f. However, the controlling method of the number of suspends is not limited thereto.

Alternatively, the numbers of suspends with rollback, suspends without rollback, and no suspends may be controlled by, for example, controlling a ratio of executions of the suspend with rollback and the suspend without rollback. For example, upon every occurrence of a request for another operation, the ratio of executions of the suspend with rollback and the suspend without rollback for the erase operation may be acquired from the erase-suspend plan table with reference to the number of erased blocks. Alternatively, the ratio may be determined from the erase-suspend plan table, upon issuance of an erase command.

To set the ratio of executions between the suspend with rollback and the suspend without rollback to 2:1, for example, a uniform random number in the range of (0, 3) (including 0 and excluding 3) is generated in response to a request for another operation during a preceding erase operation or program operation. When the random number x is 0≤x<2, the suspend with rollback is executed. When the random number x is 2≤x<3, the suspend without rollback is executed.

For another example, the numbers of suspends with rollback, suspends without rollback, and no suspends may be controlled by, for example, limiting the maximum allowable number of suspends with rollback and suspends without rollback. In this case, after the numbers of the suspends with rollback and the suspends without rollback reach the maximum allowable number, any suspend may no longer be executed.

First Modification

Next, a memory system of a first modification of the embodiment will be described with reference to FIG. 20 and FIG. 21. The memory system of the first modification is different from the embodiment in that the erase-suspend plan table is adjusted depending on the state of the memory system. The following will describe a preceding erase operation, however, the following configuration is applicable to a preceding program operation.

FIG. 20 is a diagram illustrating an exemplary erase-suspend plan table 14j of a memory controller according to the first modification of the embodiment. In the erase-suspend plan table 14j, when the number of erased blocks is two, for example, the budget count of suspends with rollback is set to N+Δ. When the number of erased blocks is one, for example, the budget count of suspends without rollback is set to N+Δ where N is a given preset number, and Δ is a adjustment value found from a plan adjustment table to be described below.

FIG. 21 is a diagram illustrating an exemplary plan correction table 14k based on a write queue depth (QD) of the memory controller according to the first modification of the embodiment. The plan adjustment table 14k is stored in the RAM of the memory controller. The write QD refers to the number of not-responded write requests among the number of write requests issued from the host to the memory system. In the following, the write QD is used as a criterion for the amount and speed of data to be written to the NAND memory 20 in the memory system. In the example of FIG. 21, an average value of the write QD in a given period is used. In calculating the average value, individual write requests may be weighted by a write data size.

In the memory system of the first modification, the calculator 11b of the memory controller adjusts the erase-suspend plan table 14j on the basis of the plan adjustment table 14k, for example. The larger the write QD is, the earlier the erased blocks are used (i.e., written or programmed), so that the erased blocks may be used up by frequent issuance of suspend commands. For example, when the number of erased blocks is two and the average value of the write QD is zero, the calculator 11b sets the budget count of suspends with rollback to (N+1) using a predeterminate adjustment value "1" in the plan adjustment table 14k. Thereby, the budget count of suspends with rollback and the budget count of suspends without rollback are set to (N+1) and one, respectively. When the number of the erased blocks is one and the average value of the write QD is three, for example, the budget count of suspend without rollback is set to (N+(−1)) (that is, (N−1)), using an adjustment value "−1" in the plan adjustment table 14k. Thereby, the budget count of suspends with rollback and the budget count of suspends without rollback are set to zero and (N−1), respectively. If the value of (N−1) takes a negative value, the budget count of suspends may be set to zero.

The memory system of the first modification adjusts the budget count of suspends in the erase-suspend plan table 14j using the plan adjustment table 14k based on the write QD. This makes it possible to estimate a future use amount of the erased blocks and to prevent the erased blocks from being used up.

Second Modification

Next, a memory system of a second modification of the embodiment will be described with reference to FIG. 20 and FIG. 22. The memory system of the second modification is different from the embodiment in that the erase-suspend plan table is adjusted on the basis of the number of program/erase cycles. The following will describe a preceding erase operation, however, the following configuration is applicable to a preceding program operation.

The memory controller of the second modification includes the erase-suspend plan table 14*j* illustrated in FIG. 20.

FIG. 22 is a diagram illustrating an exemplary plan adjustment table 14*l* based on the number of program/erase cycles, which is stored in the memory controller according to the second modification of the embodiment. The plan adjustment table 14*l* is stored in the RAM of the memory controller. The number of program/erase cycles refers to the number of program/erase cycles executed to a suspend target block. Herein, the term, "suspend target block" represents a block being in operation preceding another operation, which is to be suspended to give priority to said another operation.

In the memory system of the second modification, the calculator 11*b* of the memory controller adjusts the erase-suspend plan table 14*j* on the basis of the plan adjustment table 14*l*, for example. The greater the number of program/erase cycles is, the more worn out the memory cells of the block are, so that it is preferable to avoid the memory cells from being further worn out. For example, when the number of erased blocks is two and the number of the program/erase cycles to a suspend target block is 200, the calculator 11*b* sets the budget count of suspends with rollback to (N+0) (that is, N), using an adjustment value "0" in the plan adjustment table 14*l*. Thereby, the budget count of suspends with rollback and the budget count of suspends without rollback are set to N and one, respectively. When the number of erased blocks is one and the number of the program/erase cycles to the suspend target block is 600, the calculator 11*b* sets the budget count of suspends without rollback to (N−2) using an adjustment value "−2" in the plan adjustment table 14*l*. Thereby, the budget count of suspends with rollback and the budget count of suspends without rollback are set to zero and (N−2), respectively. If the value of (N−2) takes a negative value, the budget count of suspends is set to zero.

The memory system of the second modification adjusts the budget count of suspends in the erase-suspend plan table 14*j* using the plan adjustment table 14*l* based on the number of the program/erase cycles. This makes it possible to avoid degradation of reliability due to the suspend operation to worn-out memory cells, for example.

Third Modification

Next, a memory system of a third modification of the embodiment will be described with reference to FIG. 20 and FIG. 23. The memory system of the third modification is different from the embodiment in that the erase-suspend plan table is adjusted on the basis of an issuance ratio of a read request from the host 30. The following will describe a preceding erase operation by way of example, however, the following configuration is applicable to a preceding program operation.

The memory controller of the third modification includes the erase-suspend plan table 14*j* illustrated in FIG. 20.

FIG. 23 is a diagram illustrating an exemplary plan adjustment table 14*m* based on the issuance ratio of the read request, which is stored in the memory controller according to the third modification of the embodiment. The plan adjustment table 14*m* is stored in the RAM of the memory controller. Herein, the issuance ratio of the read request refers to a ratio of the number of read requests to the total number of read requests and write requests issued from the host to the memory system. The total number of read requests and write requests may be counted in a period corresponding to receiving a given number of commands. In addition, the total number of read requests and write requests may be counted in a period corresponding to receiving a given number of commands. In calculating the ratio, individual read requests may be weighted by a read data size or a write data size.

In the memory system of the third modification, the calculator 11*b* of the memory controller adjusts the erase-suspend plan table 14*j* on the basis of the plan adjustment table 14*m*, for example. With a larger number of read requests issued, that is, a higher issuance ratio of read requests, the erased blocks are less likely to be used up. To the contrary, with a larger number of write requests issued, that is, a lower issuance ratio of read requests, the erased blocks are likely to be used up. For example, when the number of erased blocks is two and the issuance ratio of read requests from the host is 1/(1+0) (that is, one), the calculator 11*b* sets the budget count of suspends with rollback to (N+2) using an adjustment value "2" in the plan adjustment table 14*m*. Thereby, the budget count of suspends with rollback and the budget count of suspends without rollback are set to (N+2) and one, respectively. In addition, when the number of erased blocks is one and the issuance ratio of read requests from the host is 3/(7+3) (that is, 0.3), the calculator 11*b* sets the budget count of suspends without rollback to (N−1) using an adjustment value "−1" in the plan adjustment table 14*m*. Thereby, the budget count of suspends with rollback and the budget count of suspends without rollback are set to zero and (N−1), respectively. If the value of (N−1) takes a negative value, the budget count of suspends is set to zero.

The memory system of the third modification adjusts the budget count of suspends in the erase-suspend plan table 14*j* using the plan adjustment table 14*m* based on the issuance ratio of read requests. This makes it possible to avoid the erased blocks from being used up, for example.

Fourth Modification

Next, a memory system of a fourth modification of the embodiment will be described with reference to FIG. 20 to FIG. 23. The memory system of the fourth modification is different from the embodiment in that part of the plan adjustment tables 14*k* to 14*m* illustrated in FIG. 21 to FIG. 23 are combined. For example, the calculator 11*b* of the memory controller adjusts the erase-suspend plan table 14*j* on the basis of all of the plan adjustment tables 14*k* to 14*m*.

The memory controller of the fourth modification includes the erase-suspend plan table 14*j* illustrated in FIG. 20.

For example, when the number of erased blocks is two, the average value of the write QD is zero, the number of the program/erase cycles to the suspend target block is 200, and the issuance ratio of the read requests from the host is one, the calculator 11*b* sets the budget count of suspends with rollback to (N+1+0+2) (that is, (N+3)), using an adjustment value "1" in the plan adjustment table 14*k*, an adjustment value "0" in the plan adjustment table 14*l*, and an adjustment value "2" in the plan adjustment table 14*m*. Thereby, the budget count of suspends with rollback and the budget count of suspends without rollback are set to (N+3) and one, respectively.

In addition, when the number of erased blocks is one, the average value of the write QD is three, the number of the program/erase cycles to the suspend target block is 600, and the issuance ratio of the read requests from the host is 0.3, the calculator 11*b* sets the budget count of suspends without rollback to (N−1−2−1) (that is, (N−4)), using an adjustment value "−1" in the plan adjustment table 14k, an adjustment value "−2" in the plan adjustment table 14l, and an adjustment value "−1" in the plan adjustment table 14m. Thereby, the budget count of suspends with rollback and the budget count of suspends without rollback are set to zero and (N−4), respectively. If the value of (N−4) takes a negative value, the budget count of suspends is set to zero.

Fifth Modification

Next, a memory system of a fifth modification of the embodiment will be described with reference to FIG. 20, FIG. 22, and FIG. 24. To adjust the erase-suspend plan table on the basis of certain data such as the write QD, the number of program/erase cycles, and the issuance ratio of read requests and write requests, the memory system of the fifth modification may use an integrated plan adjustment table of some of the plan adjustment tables 14k to 14m illustrated in FIG. 21 to FIG. 23.

The memory controller of the fifth modification includes the erase-suspend plan table 14j illustrated in FIG. 20.

FIG. 24 is a diagram illustrating an exemplary plan adjustment table 14n of the memory controller according to the fifth modification of the embodiment. The plan adjustment table 14n is stored in the RAM of the memory controller. The plan adjustment table 14n is created by integrating the plan adjustment table 14k illustrated in FIG. 21 and the plan adjustment table 14m illustrated in FIG. 23.

In the memory system of the fifth modification, the calculator 11b of the memory controller may adjust the erase-suspend plan table 14j on the basis of the plan adjustment table 14n, for example. In addition, the calculator 11b of the memory controller may adjust the erase-suspend plan table 14j on the basis of the plan adjustment tables 14l and 14n, for example.

For example, when the number of erased blocks is two, the average value of the write QD is zero, the number of program/erase cycles to the suspend target block is 200, and the issuance ratio of read requests from the host 30 is one, the calculator 11b sets the budget count of suspends with rollback to (N+0+3) (that is, (N+3)), using an adjustment value "0" in the plan adjustment table 14l, and an adjustment value "3" in the plan adjustment table 14n. Thereby, the budget count of suspends with rollback and the budget count of suspends without rollback are set to (N+3) and one, respectively.

When the number of erased blocks is one, the average value of the write QD is three, the number of program/erase cycles to the suspend target block is 600, and the issuance ratio of read requests from the host 30 is 0.3, the calculator 11b sets the budget count of suspends without rollback to (N−2−1) (that is, (N−3)), using an adjustment value "−2" in the plan adjustment table 14l, and an adjustment value "−1" in the plan adjustment table 14n. Thereby, the budget count of suspends with rollback and the budget count of suspends without rollback are set to zero and (N−3), respectively. If the value of (N−3) takes a negative value, the budget count of suspends is set to zero.

In the memory system of the fifth modification of the embodiment, the erase-suspend plan table 14j is adjusted on the basis of a combination of at least any of the write QD, the number of program/erase cycles, and the issuance ratio of read requests. This serves to further improve controllability of the suspend and properly set the numbers of suspends with rollback and suspends without rollback, and no suspends.

The memory systems of the first modification, the fourth modification, and the fifth modification of the embodiment use the write QD as a criterion for the amount and speed of write operation of the memory system, by way of example. Alternatively, other criteria such as an average value of a write throughput being the total size of write commands received from the host 30 per unit time may be used.

Sixth Modification

Next, a memory system of a sixth modification of the embodiment will be described with reference to FIG. 25A to FIG. 25D. The memory system of the sixth modification is different from the embodiment in that the number of at least either of suspends with rollback and suspends without rollback is limited.

FIG. 25A to FIG. 25D are diagrams illustrating an exemplary program-suspend limitation table of the memory controller according to the sixth modification of the embodiment.

As illustrated in FIG. 25A, the program-suspend limitation table includes a variation in the number of issued counts of program suspend with rollback in column, a variation in the number of issued counts of program suspend without rollback command in row, and both the numbers of issued counts in a matrix form. The numerical values in FIG. 25A are merely exemplary.

The program-suspend limitation table is a static table and is referred to, upon issuance of a suspend request, on the basis of the numbers of issued suspend with rollback commands and suspend without rollback commands. The numbers of issued suspend commands are reset to zero upon completion of one program operation. When an entry referred to shows one, the suspend command is issued, and when the entry referred to shows zero, the suspend command is not issued.

As illustrated in FIG. 25B, when the numbers of issued program suspend with rollback commands and program suspend without rollback commands are both one, the entry of the program-suspend limitation table is one. Thus, the suspend command is issuable.

As illustrated in FIG. 25C, when the number of issued program suspend with rollback commands is three and the number of issued program suspend without rollback commands is two, the entry of the program-suspend limitation table is zero. The suspend command is thus not issued.

As illustrated in FIG. 25D, the matrix may be formed to limit the total number of suspends with rollback and suspends without rollback, as different from the examples in FIG. 25A to FIG. 25C.

That is, the entries are set to one where the total number of issued suspends with rollback and issued suspends without rollback is less than a given number n (n=4 in the example in FIG. 25D), and the rest of the entries are set to zero. Thereby, the total number of suspends is limited to a maximum of n.

Further, the number of issued suspend with rollback commands and the number of issued suspend without rollback commands may be weighted. That is, for example, the numbers of issued suspend with rollback commands x N may be set to the columns of the matrix in FIG. 25A or FIG. 25D, and the numbers of issued suspend without rollback commands x M may be set to the rows of the matrix in FIG. 25A or FIG. 25D, to determine whether to issue the suspend command.

In the examples in FIG. 25A to FIG. 25D, the suspend with rollback command and the suspend without rollback command are managed by the same table to commonly permit or limit (prohibit) the suspend with rollback and the suspend without rollback. However, different tables may be prepared for the suspend with rollback command and the suspend without rollback command to separately permit or limit (prohibit) the suspend with rollback and the suspend without rollback.

In a memory system including either of the suspend with rollback function and the suspend without rollback function, the program-suspend limitation table includes one row or one column.

The use of the program-suspend limitation table may be applied to an erase operation.

In the memory system of the sixth modification of the embodiment, the number of at least either of suspends with rollback and suspends without rollback is limited according to at least any of the number of executed suspends with rollback, the number of executed suspends without rollback, and the number of program/erase cycles. This can prevent too frequent issuance of suspends, which would cause delay in an erase operation and a program operation. In addition, repeated suspend operations during one erase operation or one program operation leaves data unprocessed in the middle of the erase operation or program operation, and thus data retention becomes shorter. In the memory system of the sixth modification of the embodiment, the number of at least either of suspends with rollback and suspends without rollback is limited, which makes it possible to reduce degradation of reliability such as a situation that intended erase or program operation is unexecutable.

The memory system of the sixth modification of the embodiment can avoid excessive use of the suspend command and prevent a prolonged preceding operation and wear-out of the memory cells.

In the memory system of the sixth modification, the number of at least one of suspends with rollback and suspends without rollback is limited by way of example, but the sixth modification is not limited to such an example. In the memory system, the total number of suspends with rollback and suspends without rollback may be limited.

Seventh Modification

Next, a memory system of a seventh modification of the embodiment will be described with reference to FIG. 26 to FIG. 29. The memory system of the seventh modification is different from the embodiment in that the budget count of suspends is re-determined over time, in conformity with a variation in the number of erased blocks, with reference to the number of erased blocks. The following will describe a preceding erase operation. However, the following configuration is applicable to a preceding program operation.

The memory controller of the seventh modification includes at least the number of erased blocks 14a, the erase-suspend plan table 14b, and the currently available count of erase-suspend 14c of the embodiment.

FIG. 26 is a diagram illustrating an exemplary erase-suspend-available count setting time 14o of a memory controller according to the seventh modification of the embodiment. The erase-suspend-available count setting time 14o is stored may be a RAM of the memory controller. The erase-suspend-available count setting time 14o includes information on a next suspend-plan setting time t1 and a suspend-setting interval P. The next suspend-plan setting time t1 is calculated from time at which the memory controller has set a suspend plan currently referred to, and the suspend-setting interval P. The calculator lib of the memory controller updates the next suspend-plan setting time t1 at the time of determining or re-determining the suspend plan. The calculator 11b determines or re-determines the suspend plan with reference to the suspend-setting interval P of the erase-suspend-available count setting time 14o.

Figure 27:
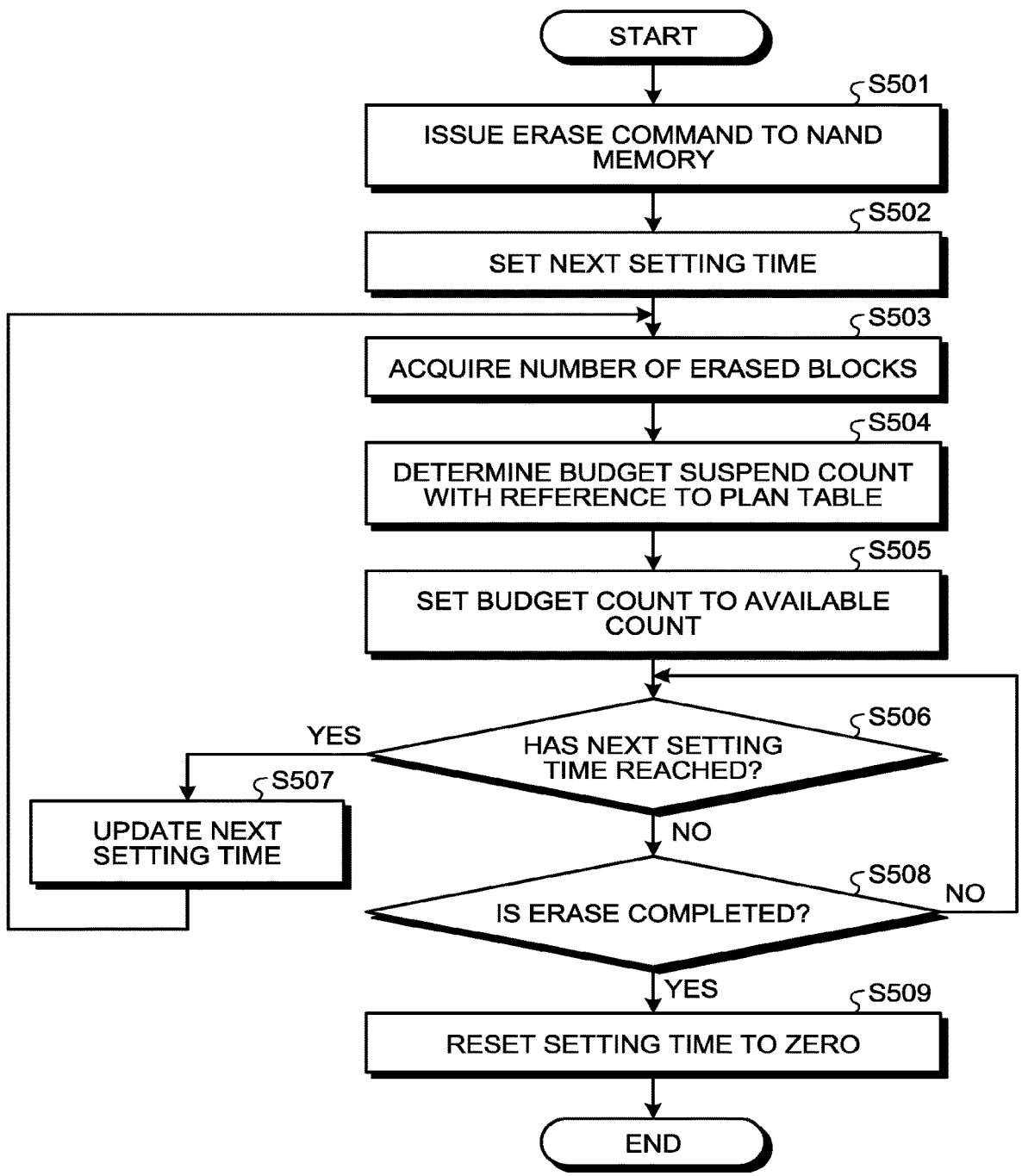
FIG. 27 is a flowchart illustrating an exemplary erase-suspend-plan setting in a memory system according to the seventh modification of the embodiment.

FIG. 27 is a flowchart illustrating an exemplary erase-suspend-plan setting procedure in the memory system according to the seventh modification of the embodiment.

As illustrated in FIG. 27, the command issuer 11c of the memory controller issues an erase command to the NAND memory at given timing (Step S501). The calculator 11b calculates next setting time from the suspend-setting interval and the time at which the erase command has been issued, and sets the time to the erase-suspend-available count setting time 14o (Step S502).

The calculator 11b acquires the number of erased blocks from the number of erased blocks 14a (Step S503). The calculator 11b determines the budget counts of suspends with rollback and budget counts of suspends without rollback in accordance with the acquired number of erased blocks, with reference to the erase-suspend plan table 14b (Step S504). The calculator 11b sets the determined budget counts of suspends to the currently available count of erase-suspend 14c as the currently available counts of suspend with rollback and suspend without rollback (Step S505).

The calculator 11b determines whether next setting time set to the erase-suspend-available count setting time 14o has reached (Step S506). After determining that the next setting time has not reached (No in Step S506), the calculator 11b determines whether the erase operation to the NAND memory is completed (Step S508). After determining that the erase operation to the NAND memory is not completed (No in Step S508), the calculator 11b returns to Step S506 and continues monitoring the current time.

After determining that the current time matches the next setting time set to the erase-suspend-available count setting time 14o (Yes in Step S506), the calculator 11b updates the next setting time (Step S507), and returns to Steps S503 to S505 to re-determine the budget counts of suspends with rollback and suspends without rollback. The number of erased blocks may decrease due to execution of the program operation, therefore, the budget counts of suspends with rollback and suspends without rollback are updated at each plan setting time.

Upon completion of the erase operation to the NAND memory (Yes in Step S508), the calculator 11b resets the next setting time and the setting interval registered in the erase-suspend-available count setting time 14o to zero (Step S509).

Figure 28:
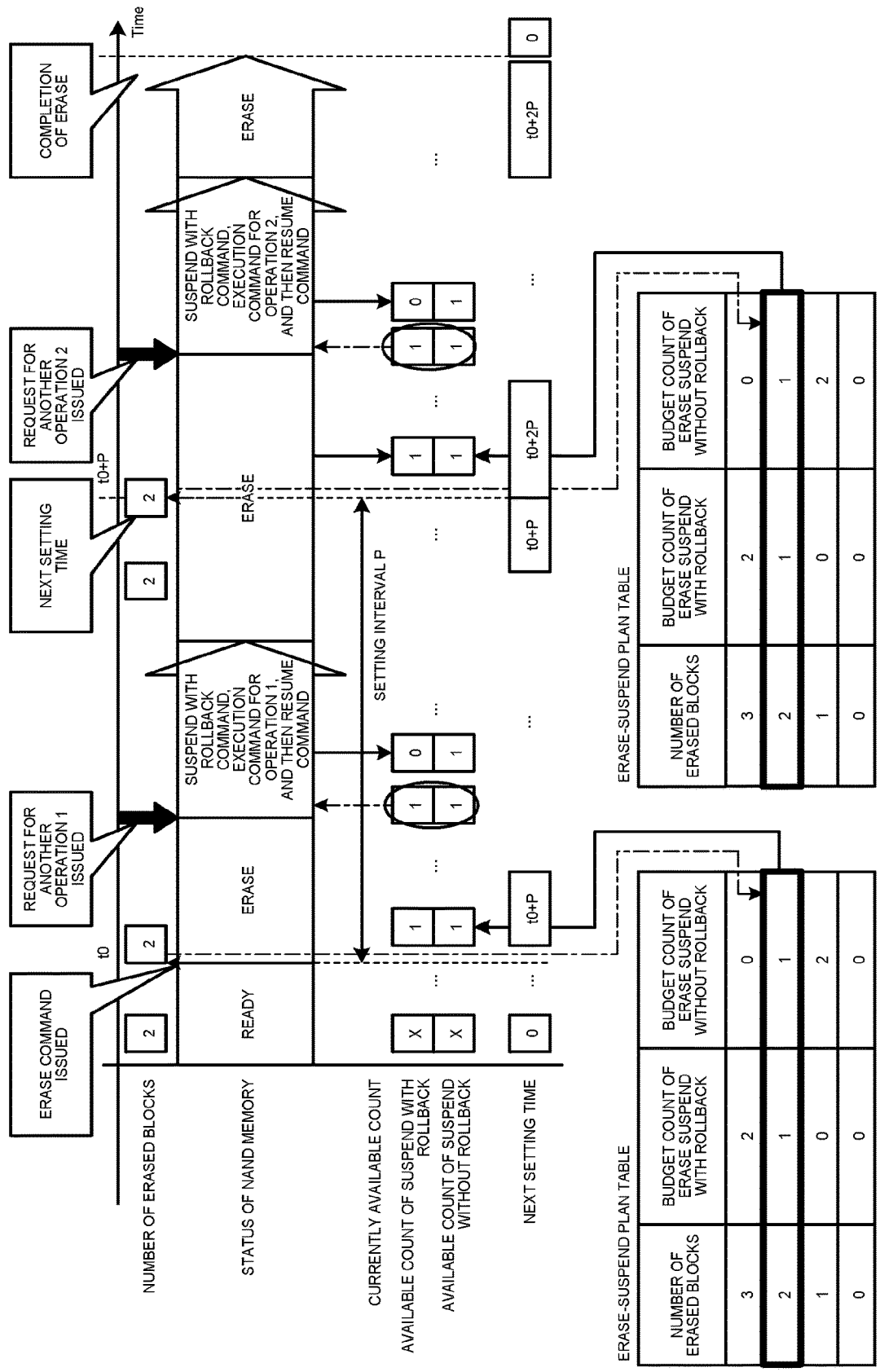
FIG. 28 is a diagram illustrating a variation in time in the available counts of suspend with rollback and the available counts of suspend without rollback which are managed in the memory system according to the seventh modification of the embodiment.

FIG. 28 is a diagram illustrating a variation in time in the currently available counts of suspend with rollback and suspend without rollback managed in the memory system according to the seventh modification of the embodiment.

In FIG. 28, in the ready state of the NAND memory, the number of erased blocks is "2". That is, the number of erased blocks 14a contains "2". Since the erase command has not been issued, the currently available counts of suspend with rollback and suspend without rollback are not set in the currently available count of erase-suspend 14c.

In response to issuance of the erase command from the command issuer 11c of the memory controller, the calculator 11b adds the setting interval P to current time t0 and registers the resultant value in the erase-suspend-available count setting time 14o as next setting time. That is, the next setting time is "t0+p". In addition, the calculator 11b acquires the number of erased blocks from the number of erased blocks 14a, and sets the budget count of suspends with rollback and the budget count of suspends without rollback to "1" with reference to the erase-suspend plan table 14b. The calculator 11b registers "1" as the currently available count of suspend with rollback and the currently available count of suspend without rollback in the currently available count of erase-suspend 14c.

Here, it is assumed that a request for first another operation (in the drawing, another operation 1) to the NAND memory being in erase operation occurs. The calculator 11b selects the suspend with rollback to be executed according to the numerical value in the currently available count of erase-suspend 14c. The command issuer 11c issues a suspend with rollback command, and issues an execution command for the first another operation to the NAND memory. The calculator 11b decreases the currently available count of suspend with rollback in the currently available count of erase-suspend 14c to "0".

The NAND memory suspends the erase operation before a given section, performs the first another operation, and then resumes the erase operation by repeating part of the operation performed before the suspend as necessary. At the time of resuming the erase operation, the number of erased blocks is assumed to "2". Then, at the next setting time "t0+P", the calculator 1ib adds the setting interval P to the current time "t0+P" and registers the resultant value as the next setting time in the erase-suspend-available count setting time 14o. That is, the next setting time is "t0+2P". In addition, the calculator 11b acquires the number of erased blocks from the number of erased blocks 14a, and sets both the budget count of suspends with rollback and the budget count of suspends without rollback to "1", with reference to the erase-suspend plan table 14b. The calculator 11b registers "1" in the currently available count of suspend with rollback and the currently available count of suspend without rollback of the currently available count of erase-suspend 14c.

In re-determining the currently available count of suspend, the calculator 11b may add the re-determined budget count of suspends to the currently available count of suspend. In this case, the currently available count of suspend with rollback and the currently available count of suspend without rollback in the currently available count of erase-suspend 14c are "1" and "2", respectively.

Here, it is assumed that a request for second another operation (in the drawing, another operation 2) occurs after resuming the erase operation, the calculator 11b selects the suspend with rollback to be executed according to the numerical value in the currently available count of erase-suspend 14c. The command issuer 11c issues a suspend with rollback command, and issues an execution command for the second another operation to the NAND memory. The calculator 11b decreases the currently available count of suspend with rollback in the currently available count of erase-suspend 14c to "0".

The NAND memory suspends the erase operation before proceeding to a given section, performs the second another operation, and then resumes the erase operation by repeating part of the operation performed before the suspend as necessary. After completion of the erase operation, the calculator 11b re-determines the next setting time and the setting interval in the erase-suspend-available count setting time 14o to zero.

The memory system of the seventh modification re-determines the budget count of suspends over time. This can avoid occurrence of a request with extremely long latency due to earlier exhaustion of budget counts of suspends.

In re-determining the plan setting time, the budget count of suspends may be set in conformity with a variation in the number of erased blocks.

Figure 29:
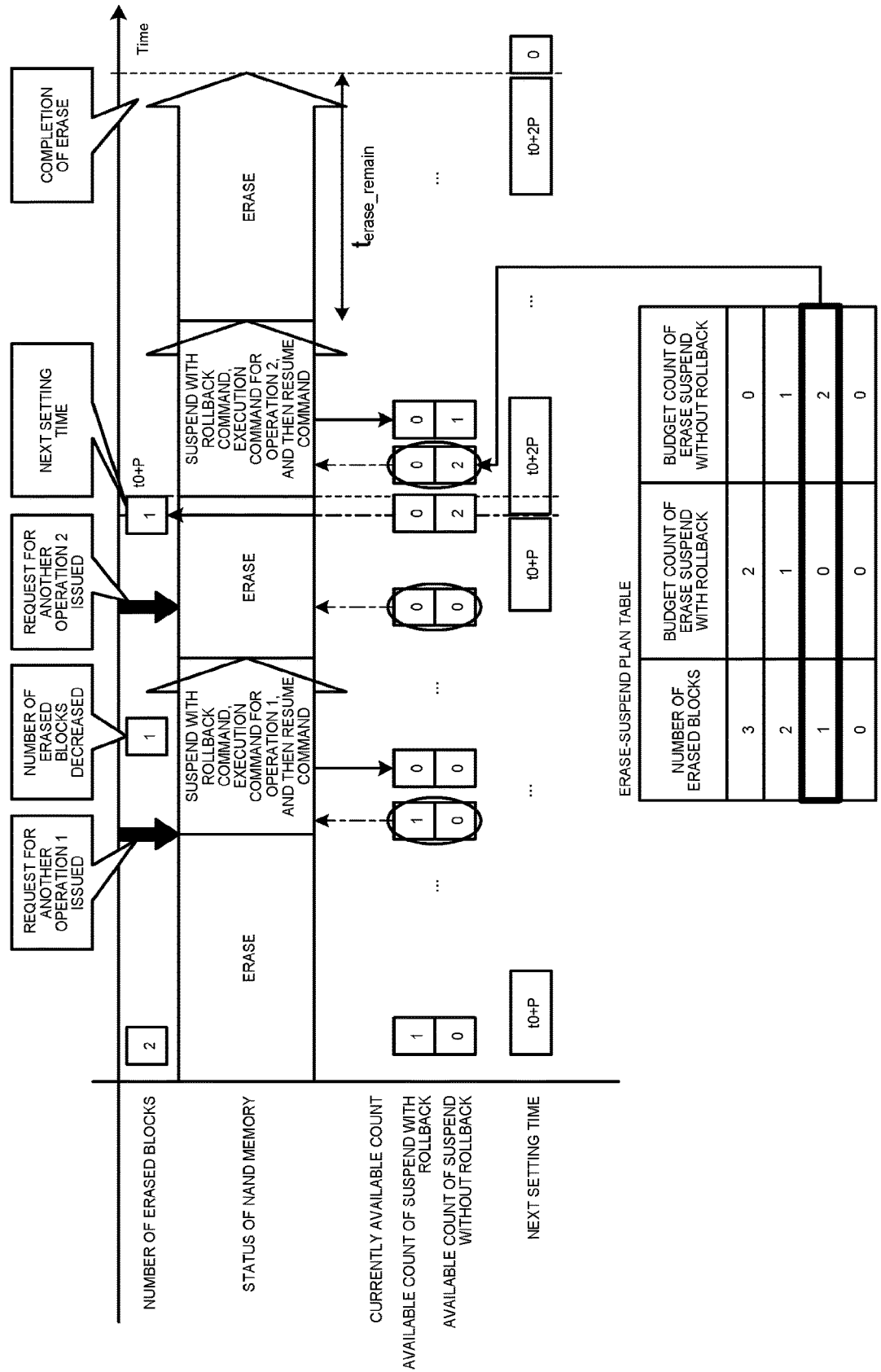
FIG. 29 is a diagram illustrating another variation in time in the available counts of suspend with rollback and the available counts of suspend without rollback which are managed in the memory system according to the seventh modification of the embodiment.

FIG. 29 is a diagram illustrating another variation in time in the currently available count of suspend with rollback and the currently available count of suspend without rollback managed in the memory system according to the seventh modification of the embodiment.

In FIG. 29, the number of erased blocks is "2" at a timing during the erase operation to the NAND memory. That is, the number of erased blocks 14a contains "2". In this state, "1" and "0" are registered in the currently available count of suspend with rollback and the currently available count of suspend without rollback of the currently available count of erase-suspend 14c, respectively.

At a subsequent timing, in response to a request for a first another operation (in the drawing, another operation 1) occurring, a suspend with rollback command is issued. Thereby, the currently available count of suspend with rollback and the currently available count of suspend without rollback in the currently available count of erase-suspend 14c are both changed to "0". At later timing, it is assumed that the number of erased blocks decreases from "2" to "1" (regardless of execution of the erase suspend operation or another operation).

Here, it is assumed that a request for a second another operation (in the drawing, another operation 2) occurs after the first another operation is executed and the erase operation is resumed. Since the currently available count of suspend with rollback and the currently available count of suspend without rollback are both zero, no suspend command is issued. However, at the next setting time "t0+P", on the basis of the determined number of erased blocks "1", so that new currently) available counts of suspend with rollback and suspend without rollback are set in the currently available count of erase-suspend 14c. The currently available count of suspend with rollback and the currently available count of suspend without rollback in the currently available count of erase-suspend 14c are newly set to "0" and "2", respectively.

Then, the memory controller issues a suspend without rollback command to cause the NAND memory to execute the second another operation (in the drawing, another operation 2). Thereby, the currently available count of suspend with rollback and the currently available count of suspend without rollback in the currently available count of erase-suspend 14c are changed to "0" and "1", respectively.

The memory system of the seventh modification sets the currently available count of suspend in a time-division manner, to thereby make the numbers of executions of suspend with rollback and suspend without rollback uniform. This can avoid earlier exhaustion of budget counts of suspends, and reduce occurrence of a request with extremely long latency, leveling the latency.

The currently available count of suspend may be re-determined at a timing at which the number of erased blocks varies, regardless of a given period.

Hereinbefore, a description has been given of a method of optimizing the state of the memory system by controlling the numbers of suspends with rollback and suspends without rollback on the basis of the number of erased blocks. However, the scope of the embodiment is not limited thereto.

For example, the numbers of suspends with rollback and suspends without rollback may be controlled on the basis of the number of executed suspend operations in one preceding operation. In this case, when the number of executed suspends in one preceding operation is less than a given number, the suspend with rollback is selected. Along with an increase in the number of suspends, the suspend without rollback is preferably selected. When the number of suspends exceeds an allowable value, neither the suspend with rollback nor the suspend without rollback is selected (that is, no suspends).

For another example, the numbers of suspends with rollback and suspends without rollback may be controlled on the basis of the number of read operations executed by the NAND memory 20 in a suspend period of one preceding operation. In this case, the suspend with rollback is selected when the number of read operations executed by the NAND memory 20 in the suspend period of one preceding operation is less than a given value. Along with an increase in the number of read operations, the suspend without rollback is preferably selected. When the number of read operations exceeds an allowable value, neither the suspend with rollback nor the suspend without rollback is selected (that is, no suspend).

For still another example, the numbers of suspends with rollback and suspends without rollback may be controlled depending on a length of suspend period in one preceding operation. In this case, the suspend with rollback is selected when the suspend period (by integration) of the preceding operation is less than a given value. Along with an increase in the suspend period, the suspend without rollback is preferably selected. Neither the suspend with rollback nor the suspend without rollback is selected when the suspend period exceeds an allowable value (that is, no suspends).

Other Modifications

The memory system 1 of the embodiment controls the frequency of the suspends with rollback, the suspends without rollback, and no suspend in accordance with the state of the memory system 1 such as the number of erased blocks and the free space of the write buffer 14g by way of example. Alternatively, the blocks of the NAND memory may be divided into a plurality of regions, to control the frequency of the suspends with rollback, the suspends without rollback, and no suspends individually for the regions depending on the state of each region.

In the case of the NAND memory including divided regions, the NAND memory may include a plurality of memory chips, for example. In this case, the memory controller may acquire the number of erased blocks in each memory chip, the write QD for the memory chip, the number of write and erase operations to the blocks in the memory chip, an issuance ratio of read and write commands for the memory chip, to be able to appropriately set the frequency of the suspend with rollback, the suspend without rollback, and no suspend for each memory chip.

In addition, in dividing the NAND memory into a plurality of regions, write buffer regions may be allocated to each memory chip. In this case, the memory controller may acquire the free space of a write buffer allocated to each memory chip, to be able to appropriately set the frequency of the suspend with rollback, the suspend without rollback, and no suspends for each memory chip.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a nonvolatile memory including a plurality of blocks, each of the plurality of blocks including a plurality of memory cells: and
a memory controller configured to control operation of the nonvolatile memory, wherein
the nonvolatile memory is configured to:
receive, from the memory controller, a first command for execution of at least one of an erase operation and a program operation,
in response to receiving a second command from the memory controller during execution of a first operation requested by the first command, execute a second operation for suspending the first operation before the first operation reaches a given section, and
in response to receiving a third command from the memory controller during the execution of the first operation, execute a third operation for suspending the first operation after the given section. the third command being different from the second command, wherein
the memory controller is further configured to:
in response to occurrence of a request for another operation while the first operation is executed by the nonvolatile memory, selectively allow the nonvolatile memory to execute one of the second operation, the third operation, and continuance of the first operation, wherein
the memory controller is configured to:
allow the nonvolatile memory to execute the second operation when the number of erased blocks of the nonvolatile memory is A,
allow the nonvolatile memory to execute the third operation when the number of erased blocks of the nonvolatile memory is B where A>B, and
allow the nonvolatile memory to continue the first operation when the number of erased blocks of the nonvolatile memory is C where B>C.

2. The memory system according to claim 1, wherein the nonvolatile memory is configured to:
resume the first operation suspended by the second operation by re-executing part of the first operation; and
resume the first operation suspended by the third operation from after the given section.

3. The memory system according to claim 1, wherein the memory controller is further configured to:
allow the nonvolatile memory to execute the second operation when the number of write requests not responded to a host among write requests from the host is A,
allow the nonvolatile memory to execute the third operation when the number of write requests not responded to the host among the write requests from the host is B where A<B, and
allow the nonvolatile memory to continue the first operation when the number of write requests not responded to the host among the write requests from the host is C where B<C.

4. The memory system according to claim 1, wherein the memory controller is further configured to:
allow the nonvolatile memory to execute the second operation when a ratio of the number of read requests to a total number of the read requests and write requests from a host in a given period is A,
allow the nonvolatile memory to execute the third operation when the ratio of the number of the read requests to the total number of the read requests and the write requests from the host in the given period is B where A>B, and allow the nonvolatile memory to continue the first operation when the ratio of the number of the read requests to the total number of the read requests and the write requests from the host in the given period is C where B>C.

5. The memory system according to claim 1, wherein the memory controller is further configured to:

allow the nonvolatile memory to execute, the second operation when amount of data received from a host and not yet having been written to the nonvolatile memory is A, allow the nonvolatile memory to execute the third operation when the amount of data received from the host and not yet having been written to the nonvolatile memory is B where A<B, and allow the nonvolatile memory to continue the first operation when the amount data received from the host and not yet having been written to the nonvolatile memory is C where B<C.

6. The memory system according to claim 1, wherein the memory controller is further configured to:

allow the nonvolatile memory to execute the second operation when the number of program/erase cycles executed on a target block of the nonvolatile memory managed by the memory controller is A, the target block being a target of the first operation, allow the nonvolatile memory to execute the third operation when the number of program/erase cycles executed on the target block of the nonvolatile memory managed by the memory controller is B where A<B, and allow the nonvolatile memory to continue the first operation when the number of program/erase cycles to the target block of the nonvolatile memory managed by the memory controller is C where B<C.

7. The memory system according to claim 1, wherein the memory controller is further configured to:

allow the nonvolatile memory to execute the second operation when the number of times the first operation has been suspended is A, allow the nonvolatile memory to execute the third operation when the number of times the first operation has been suspended is B where A<B, and allow the nonvolatile memory to continue the first operation when the number of times the first operation has been suspended is C where B<C.

8. The memory system according to claim 1, wherein the memory controller is further configured to:

allow the nonvolatile memory to execute the second operation when the number of executed read operations while the first operation is suspended is A, allow the nonvolatile memory to execute the third operation when the number of executed read operations while the first operation is suspended is B where A<B, allow the nonvolatile memory to continue the first operation when the number of executed read operations while the first operation is suspended is C where B<C.

9. The memory system according to claim 1, wherein the memory controller is further configured to:

allow the nonvolatile memory to execute the second operation when the first operation has been suspended for a period of A, allow the nonvolatile memory to execute the third operation when the first operation has been suspended for a period of B where A<B, and allow the nonvolatile memory to continue the first operation when the first operation has been suspended for a period of C where B<C.

10. The memory system according to claim 1, wherein the memory controller is further configured to limit at least one of the number of second operations in one first operation and the number of third operations in one first operation.

11. The memory system according to claim 10, wherein the memory controller is configured to limit at least one of the number of second operations and the number of third operations, in accordance with at least one among the number of executions of the second operation in a given period, the number of executions of the third operation in the given period, and the number of program/erase cycles executed on a block being a target of the first operation.

* * * * *